(12) United States Patent
Shori

(10) Patent No.: US 7,936,637 B2
(45) Date of Patent: May 3, 2011

(54) SYSTEM AND METHOD FOR SYNCHRONIZING ASYNCHRONOUS SIGNALS WITHOUT EXTERNAL CLOCK

(75) Inventor: Aidan Shori, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 480 days.

(21) Appl. No.: 12/165,257

(22) Filed: Jun. 30, 2008

(65) Prior Publication Data

US 2009/0323457 A1   Dec. 31, 2009

(51) Int. Cl.
*G11C 8/00* (2006.01)
(52) U.S. Cl. .............................. 365/233.1; 365/233.12
(58) Field of Classification Search .............. 365/233.1, 365/233.12, 233.11
See application file for complete search history.

(56) References Cited

U.S. PATENT DOCUMENTS

| 6,948,084 B1 * | 9/2005 | Manapat et al. | 713/400 |
| 2005/0094432 A1 * | 5/2005 | Johnson et al. | 365/154 |

OTHER PUBLICATIONS

Stein, Mike; Crossing the Abyss: Asynchronous Signals in a Synchronous World; Jul. 24, 2003; www.edn.com.
Crews, Michael and Yuenyongsgool, Yong; Practical Design for Transferring Signals Between Clock Domains; Feb. 20, 2003; www.edn.com.

* cited by examiner

*Primary Examiner* — Vu A Le
(74) *Attorney, Agent, or Firm* — Fletcher Yoder

(57) ABSTRACT

One or more techniques are provided for the synchronization of asynchronous signals without the use of an external system clock. In one embodiment, an asynchronous synchronization device is provided and configured to synchronize one or more asynchronous signals to an internal clock signal provided by an internal clock generator. The internal clock generator may be enabled upon detecting inputs on the one or more asynchronous signals, and disabled once the one or more asynchronous inputs are synchronized with the internal clock signal. Thus, the internal clock signal is provided only for a duration required to synchronize the one or more asynchronous signals. Embodiments of the asynchronous synchronization device, as disclosed herein, may be implemented in a processor-based device and/or a memory device.

26 Claims, 15 Drawing Sheets

SYSTEM AND METHOD FOR SYNCHRONIZING ASYNCHRONOUS SIGNALS WITHOUT EXTERNAL CLOCK

BACKGROUND

1. Field of the Invention

Embodiments of the present invention relate generally to techniques for synchronizing two or more signals and, more particularly, to a technique for synchronizing two or more asynchronous signals without the use of an external system clock.

2. Description of the Related Art

In high speed memory devices, such as Double Data Rate Synchronous Dynamic Random Access Memory (DDR SDRAM) devices, it is often desirable to synchronize the timing of certain signals, such as clock signals and data signals, which may be external to the memory devices, with internally generated clock signals, data signals, or other external signals. Various synchronization devices may be implemented to synchronously control a memory device to provide an output signal that is matched in terms of frequency and/or phase to an input signal, which may be a free running external system clock signal, for example.

In certain SDRAM devices, data output may be synchronized using a synchronization circuit, such as a delay lock loop (DLL), which may control the internal clock of the memory device so as to synchronize data output with the rising and/or falling edges of an external system clock. Typically, the DLL circuitry detects a phase difference between a reference clock signal, which may be generated or derived from the external system clock, and a data output signal of the memory device. Based upon the detected phase difference, the DLL circuit may generate a corresponding feedback signal representative of the difference which is used to introduce or remove delay elements as needed in order to attain alignment of the data output signal with the external system clock, thus synchronizing the signals.

While the synchronization of signals under the synchronous control of an external system clock in the manner described above is desirable for preventing erroneous data due to misaligned signals, the power necessary for providing a constant running external system clock signal presents an obstacle for portable electronic devices, which may rely on limited power provided by a battery source for operation, for instance. Such portable electronic devices may also utilize low power circuitry design and low power modes of operation in which an external clock signal may not always be available and, in certain scenarios, may even be undesirable. Furthermore, when viewed in the context of power consumption, the use of an external clock for clocking slower asynchronous signals (e.g., those which pulse only once or a few times over many clock periods ($t_{CK}$)) may be considered inefficient. However, without a mechanism to bring asynchronous signals into a common clock domain, it cannot be guaranteed that all of the internal logic of the device will operate in the same frequency domain during asynchronous operation, thus increasing the risk of erroneous data inputs or outputs due to signal misalignments.

Embodiments of the present invention may be directed to one or more of the problems set forth above.

DETAILED DESCRIPTION OF SPECIFIC EMBODIMENTS

As discussed in further detail below, embodiments of the present invention provide techniques which may be implemented on various electronic devices to provide for the synchronization of asynchronous signals without the need for an external system clock signal. In one embodiment, an asynchronous synchronization device is provided for receiving one or more asynchronous signals. The asynchronous synchronization device may include an internal clock generator, which is enabled upon receiving and latching one or more asynchronous input signals, and configured to provide a temporary internal clock signal to a synchronization circuit. The temporary internal clock signal may serve as a reference signal for controlling the synchronization of the asynchronous signal or signals. Because the need for a constant free-running external system clock is reduced or eliminated under certain scenarios, a device utilizing embodiments of the present invention may advantageously realize significant power savings. These and other features, aspects, and advantages will be discussed in further detail with regard to the following description of various embodiments of the present invention.

Figure 1:
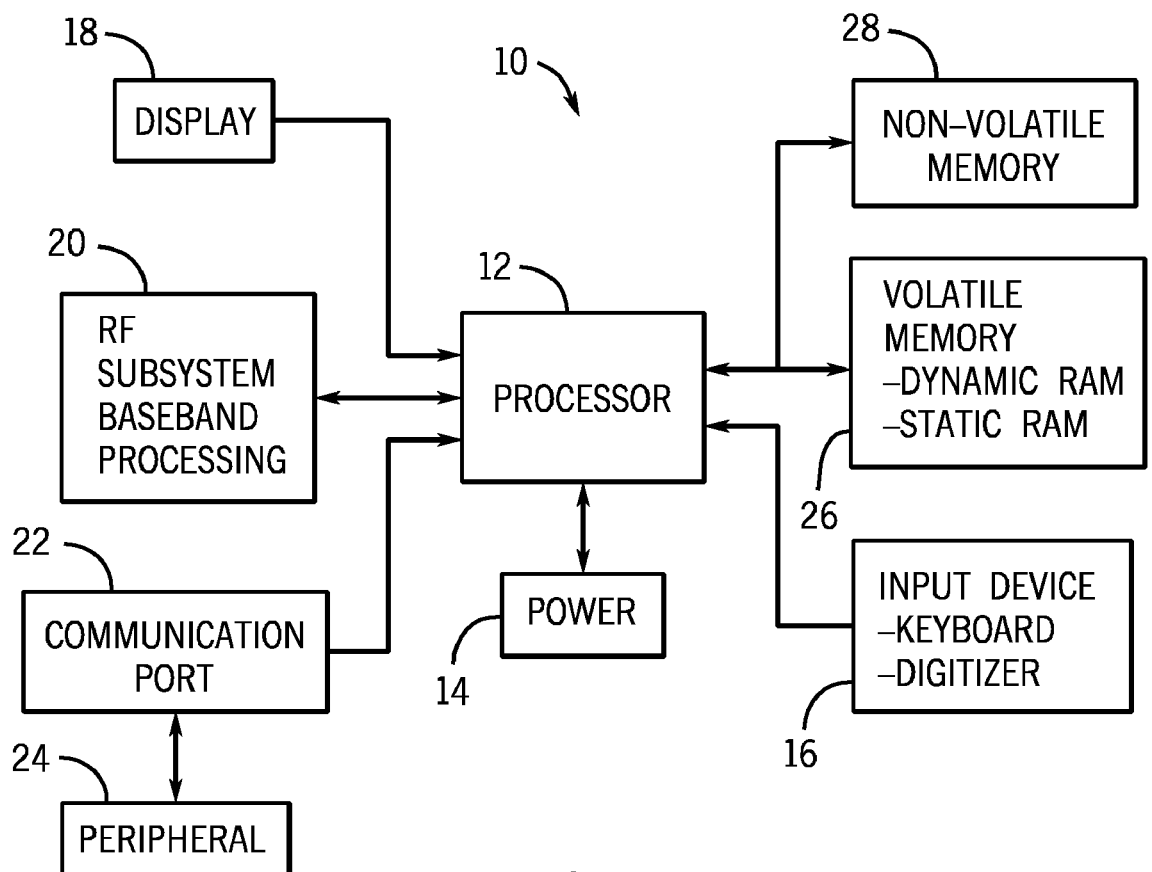
FIG. 1 is a block diagram illustrating a processor-based device which may incorporate embodiments of the present invention.

Turning now to the drawings and referring initially to FIG. 1, a block diagram depicting a processor-based device, generally designated by the reference numeral 10, is illustrated. The device 10 may incorporate embodiments of the present invention. The device 10 may be any of a variety of different types, such as a computer, portable media player, cellular telephone, pager, personal organizer, control circuit, or the like. In a typical processor-based device, a processor 12, such as a microprocessor, may be used to control various functions of the device 10.

The device 10 typically includes a power supply 14. For instance, if the device 10 is portable, the power supply 14 may advantageously include one or more rechargeable and/or replaceable batteries. The power supply 14 may also include an A/C adapter so that the device may be plugged into a wall outlet. The power supply 14, in some embodiments, may further include a D/C adapter, so that the device 10 may be plugged into a vehicle's lighter port.

As will be appreciated by those skilled in the art, the power supply 14 may include or operate in conjunction with power regulation circuitry (not shown) to control power consumption based on how the device 10 is being operated. For example, if the device 10 is being operated in a portable setting where A/C power is generally unavailable, such as when a user is traveling, exercising, driving, or so forth, the device 10 may rely solely on batteries for providing power. Because batteries are generally capable of storing a limited amount of charge before requiring replacement or recharging, the device 10 may utilize the power regulation circuitry to operate in one or more "low power" modes of operation designed to conserve power by minimizing the overall power consumption of the device 10 in order to maximize total battery life. By way of example, low power modes of operation may include reducing the total power supplied to one or more components within the device 10 (e.g., reduce LCD backlight power on the display 18), as well as stand-by modes. Alternatively, if the device 10 is being operated in a non-portable setting, such as where A/C power is readily available, then the power supply 14 and the power regulating circuitry may allow the device 10 to operate on the externally provided A/C power without the need to conserve power. Further, if the device 10 includes rechargeable batteries, as discussed above, the A/C power may also be used to concurrently charge the batteries.

Various other devices may be coupled to the processor 12, depending upon the functions that the device 10 is configured to perform. For instance, a user interface 16 may be coupled to the processor 12. The user interface 16 may include an input device, such as buttons, switches, a keyboard, a light pen, a mouse, and/or a voice recognition system, for instance. A display 18 may also be coupled to the processor 12. The display 18 may include a liquid crystal display (LCD), a light emitting diode (LED) based display, an organic light emitting diode (OLED) based display, or some other suitable display. Further, in one embodiment, the display 18 may include touch-screen capabilities allowing the display 18 to dually-operate as the user interface 16 by responding to physical contact by a user (e.g., finger, stylus, etc.).

An RF subsystem/baseband processor 20 may also be coupled to the processor 12. The RF subsystem/baseband processor 20 may include an antenna that is coupled to an RF receiver and to an RF transmitter (not shown in FIG. 1). A communication port 22 may also be coupled to the processor 12. The communication port 22 may be adapted to be coupled to a peripheral device 24, such as a modem, a printer, or a computer, for instance, or to a network, such as a local area network (LAN), personal area network (PAN) (e.g., Bluetooth, Ultra-Wideband, etc.), or the Internet.

Because the functions of the device 10 are generally under the control of software programming executable by the processor 12, memory is coupled to the processor 12 to store and facilitate execution of one or more software programs. For instance, the processor 12 may be coupled to volatile memory 26, which may include dynamic random access memory (DRAM), static random access memory (SRAM), Double Data Rate (DDR) memory, etc. The processor 12 may also be coupled to non-volatile memory 28. The non-volatile memory 28 may include a read only memory (ROM), such as an EPROM, EEPROM, or Flash Memory, to be used in conjunction with the volatile memory 26. The size of the ROM is typically selected to be just large enough to store any necessary operating system, application programs, and fixed data. The volatile memory 26, on the other hand, is generally configured for storing dynamically loaded applications and, therefore, may be quite large. Additionally, the non-volatile memory 28 may include a high capacity memory, such as a disk drive, tape drive memory, CD-ROM drive, DVD-ROM drive, a CD or DVD writeable/rewritable (CD-RW, DVD-RW) drive, and/or a floppy disk drive.

In one embodiment, the volatile memory 26 may include a number of SDRAMs which implement DDR technology. DDR SDRAMs effectively double the allowable throughput of the memory device by supporting data transfers on each of the rising and falling edges of a clock signal. As discussed above, SDRAM is controlled synchronously by way of an external timing source, such as a system clock. To accomplish synchronous control, latches may be used to provide data and other information on the inputs and outputs of the SDRAM. For example, in a read operation, the processor 12 may access a data output latch a predetermined number of clock cycles after issuing a corresponding read request. The predetermined number of clock cycles typically corresponds to the amount of time required to access the requested data, move the data to the output latch, and allow the data to stabilize. The data is then clocked out of the output latch synchronous with the system clock which provides the timing source for the processor 12.

The synchronization of the latched output data signal to the system clock is generally performed via a synchronization circuit, which may be a delay locked loop (DLL) circuit, a measure controlled delay (MCD) circuit, a synchronous mirror delay (SMD) circuit, or the like. In general, the synchronization device locks the data output signal to the system clock by shifting the output data in time such that it is nominally aligned with the system clock. Thus, the synchronization device can compensate for timing delays introduced by various components in the SDRAM, thus preventing errors due to signal misalignments. Write operations (e.g., input data) may also be performed synchronously or in synchronization with a timing source, such as the system clock or other externally provided timing source. For instance, the input data may be clocked into an input latch and written to a memory array within the volatile memory 28 under control of an external clock, which may be provided by the external device which is performing the write operation.

Although the synchronization of the input and output signals of the volatile memory 26 to an external system clock functions to prevent errors due to misaligned data and/or control signals, there may be instances in which the external system clock is not available, or in which the use of the external system clock is undesirable. For example, due to power requirements relating to providing a constant running system clock, it may be beneficial to temporarily disable the external system clock to conserve power when the device 10 is operating in a low power mode of operation. Additionally, the use of a constant running external system clock to clock slow signals, such as those which may only pulse or toggle once over many $t_{CK}$ may be not be efficient in terms of power consumption. In either of the above-described circumstances, it may be desirable to operate the device 10 and volatile memory 26 asynchronously without the control of an external system clock. Thus, in order to properly synchronize signals and to prevent data input and output errors due to signal misalignment while the device 10 is being operated asynchronously, the volatile memory 26 may further include additional synchronization circuitry configured to synchronize asynchronous input and/or output signals without the need for the external system clock signal, as described further below.

Figure 2:
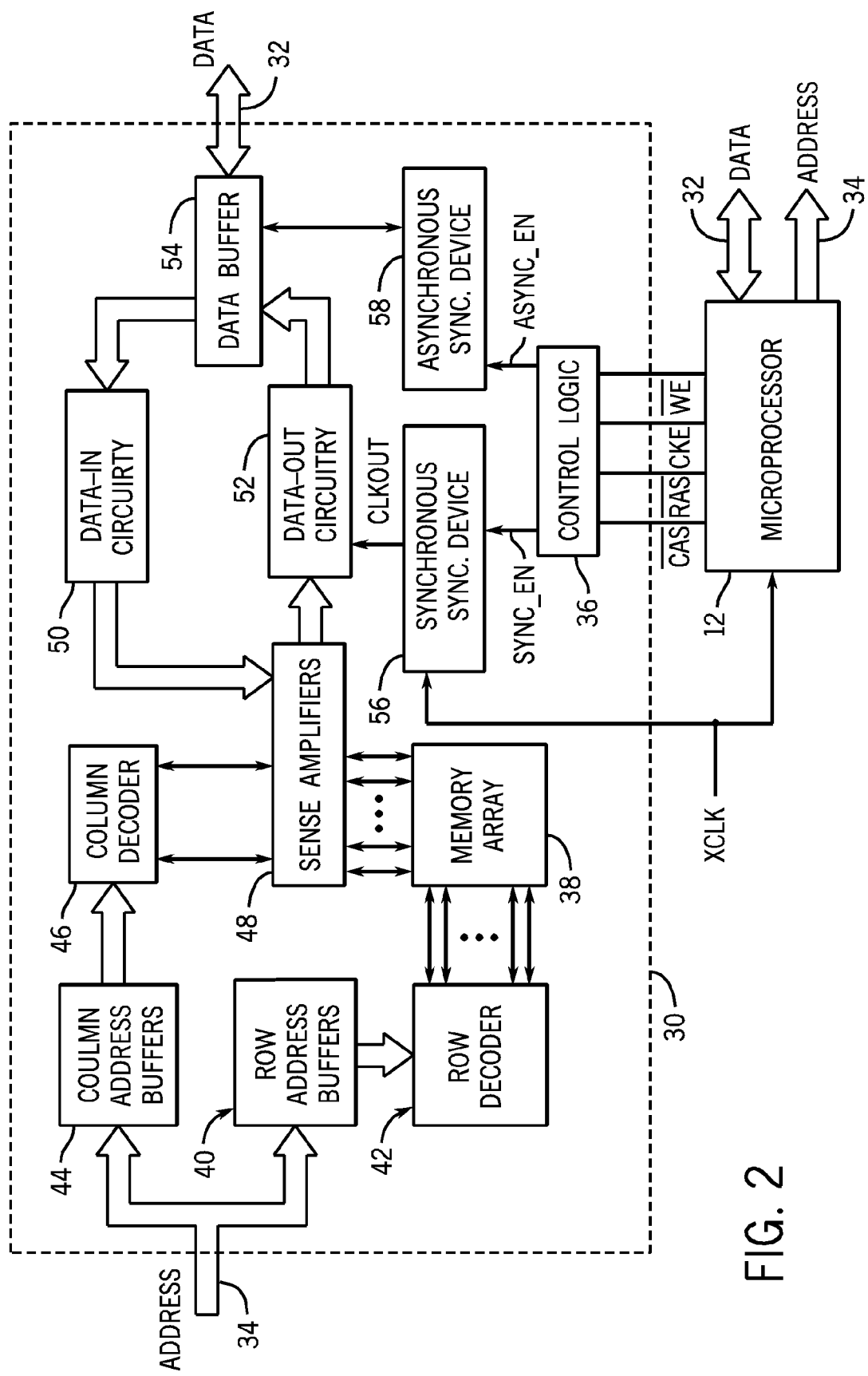
FIG. 2 is a block diagram illustrating a memory device including an asynchronous synchronization device which may be used in the processor-based device of FIG. 1 in accordance with an embodiment of the present invention.

Referring now to FIG. 2, a block diagram depicting an embodiment of a DDR SDRAM which may implement embodiments of the present invention is illustrated. The description of the DDR SDRAM 30 has been simplified for illustrative purposes and is not intended to be a complete description of all features of a DDR SDRAM. Further, the present technique may not be limited to DDR SDRAMs, and may be utilized in other synchronous memory devices, and other devices for use in communication applications, such as double-edge triggered applications, which may benefit from strict adherence to timing. Those skilled in the art will recognize that various devices may be used in the implementation of embodiments of the present invention.

Control, address, and data information provided over a memory bus are represented by individual inputs to the DDR SDRAM 30. These individual representations are illustrated by a data bus 32, address lines 34, and various discrete lines directed to control logic 36. The SDRAM 30 also includes a memory array 38 which comprises rows and columns of addressable memory cells. As can be appreciated by those skilled in the art, each memory cell in a row is coupled to a word line, and each memory cell in a column is coupled to a bit line. Further, each cell in the memory array 38 typically includes a storage capacitor and an access transistor.

The SDRAM 30 may interface with, for example, the processor 12, such as a microprocessor, by way of address lines 34 and data lines 32. Alternatively, the SDRAM 30 may interface with other devices, such as an SDRAM controller, a microcontroller, a chip set, or other electronic system. The microprocessor 12 may also provide a number of control signals to the SDRAM 30. Such signals may include row and column address strobe signals RAS and CAS, a write enable signal WE, a clock enable signal CKE, and other conventional control signals. The control logic 36 controls the many available functions of the SDRAM 30. In addition, various other control circuits and signals not detailed herein may contribute to the operation of the SDRAM 30, as can be appreciated by those of ordinary skill in the art.

A row address buffer 40 and row decoder 42 receive and decode row addresses from the row address signals provided on the address lines 34. Each unique row address may correspond to a row of cells in the memory array 38. The row decoder 42 typically includes a word line driver, an address decoder tree, and circuitry which translates a given row address received from the row address buffer 40 and selectively activates the appropriate word line of the memory array 38 by way of the word line drivers.

A column address buffer 44 and a column decoder 46 receive and decode column address signals provided on the address lines 34. The column decoder 46 may also determine when a column within the memory array 38 is defective, as well as the address of a replacement column. The column decoder 46 is coupled to sense amplifiers 48, each of which may be coupled to complementary pairs of bit lines of the memory array 38.

The sense amplifiers 48 are coupled to data-in (e.g., write) circuitry 50 and data-out (e.g., read) circuitry 52. The data-in circuitry 50 and the data-out circuitry 52 may include various data drivers and latches configured to provide input and output data on the data bus 32 of the SDRAM 30, and may be further coupled to a data buffer 54, which may include one or more buffers for delaying, regenerating, and storing data signals communicated between the microprocessor 12 and the SDRAM 30. For instance, during a write operation, the data bus 32 provides data to the data-in circuitry 50. The sense amplifiers 48 receive the data from the data-in circuitry 50 and store the data to corresponding cells in the memory array 38, for example, as a charge on a capacitor of a cell at an address specified on the address line 34. In one embodiment, the data bus 32 may be an 8-bit data bus capable of transferring data at a frequency of 400 MHz or higher.

During a read operation, the SDRAM 30 transfers data to the microprocessor 12 from the memory array 38. Complementary bit lines for the accessed cell are equilibrated during a precharge operation to a reference voltage provided by an equilibration circuit (not shown) and a reference voltage supply. The charge stored in the accessed cell is then shared with the corresponding bit lines. The sense amplifier 48 then detects and amplifies a difference in voltage between the complementary bit lines. The address information received on address lines 34 is used to select a subset of the bit lines, which is then coupled to complementary pairs of input/output (I/O) wires or lines. The I/O wires pass the amplified voltage signals to the data-out circuitry 52, the data buffer 54, and eventually out to the data bus 32 to be transmitted to the microprocessor 12.

The data-out circuitry 52 may include a data driver (not shown) to drive data out onto the data buffer 54 and the data bus 32 in response a read request directed to the memory array 38. Further, the data-out circuitry 52 may include a data latch (not shown) to latch the read data until it is driven out onto the data buffer 54 and the data bus 32 by the data driver. When the SDRAM 30 is being controlled synchronously, the timing source for the data latch may be provided by a synchronization device 56 adapted to provide a shifted clock signal (CLK-OUT) which is synchronous with the external system clock signal (XCLK), thus locking the output data signal DATA on the data bus 32 to the system clock XCLK. For instance, the synchronization device 56 may include a DLL, SMD, or MCD synchronization circuit, or the like.

As one skilled in the art will appreciate, synchronization of the output signals by the synchronization device 56 in the manner set forth above depends on the external clock signal XCLK being available. However, as discussed above, the external clock signal XCLK may not always be available during operation of the SDRAM 30. For instance, if the device 10 is in a low power mode of operation, the external clock may be temporarily disabled in order to conserve power, and the device 10 and the SDRAM 30 may operate asynchronously. In order to provide for the synchronization of asynchronous signals when the external clock signal XCLK is unavailable, the SDRAM 30 may further include an asynchronous synchronization device 58 adapted to synchronize signals without the need for the external clock signal XCLK. For instance, the asynchronous synchronization device 58 may be coupled to the data buffer 54 to receive and provide for synchronization of asynchronous input and/or output signals.

As presently illustrated, the synchronous synchronization device 56 and the asynchronous synchronization device 58 are each controlled by the control logic 36 by way of the control lines designated by the reference labels SYNC_EN and ASYNC_EN, respectively. For instance, the control logic 36 may be adapted to detect if the external clock signal XCLK is available, and to enable and/or disable the synchronous synchronization device 56 and the asynchronous synchronization device 58 based on whether the external clock signal XCLK is available. By way of example, when the SDRAM 30 is controlled synchronously and the external clock signal XCLK signal is present, the control logic 36 may enable the synchronous synchronization device 56 via the control line SYNC_EN and disable the asynchronous synchronization device 58 via the control line ASYNC_EN. Similarly, when the SDRAM 30 is being operated asynchronously, such as during a low power mode of operation where the external clock signal XCLK is unavailable, the control logic 36 may disable the synchronous synchronization device 56 via the control line SYNC_EN and enable the asynchronous synchronization device 58 via the control line ASYNC_EN. Thus, the control logic 36, synchronous synchronization device 56, and asynchronous synchronization device 58 operate in conjunction to provide for the synchronization of signals to and from the SDRAM 30 regardless of whether the external clock signal XCLK is available.

Figure 3:
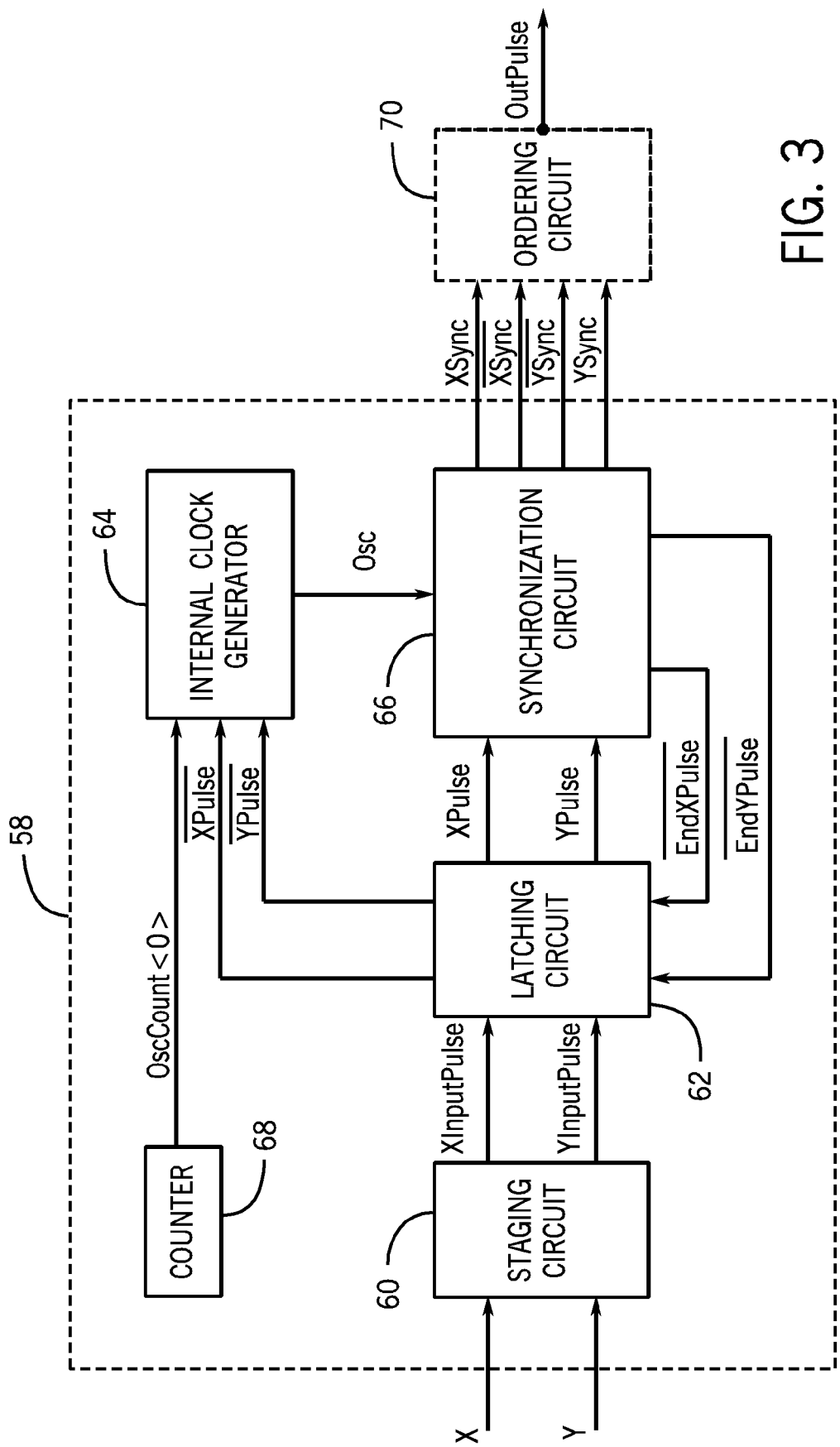
FIG. 3 is a block diagram illustrating the asynchronous synchronization device of FIG. 2 in accordance with an embodiment of the present invention.

Turning now to FIG. 3, a block diagram depicting various components which may be used in the asynchronous synchronization circuit 58 of FIG. 2 is illustrated in accordance with an embodiment of the present invention. As an overview, the embodiment of the asynchronous synchronization circuit 58 depicted in FIG. 3 is shown as receiving two asynchronous input signals, designated by the reference labels X and Y. The X and Y input signals are subsequently processed by a staging circuit 60, a latching circuit 62, and a synchronization circuit 66 to produce two synchronized output signals XSync and YSync which correspond to the original X and Y input signals, respectively. The synchronization of the X and Y input signals is controlled by an internal clock generator circuit 64 and a counter 68. As shown in FIG. 3, the synchronized XSync and YSync signals may be further processed by an optional ordering circuit 70. The following paragraphs are provided to describe the general operation of each of the staging circuit 60, latching circuit 62, internal clock generator circuit 64, synchronization circuit 66, counter 68, and ordering circuit 70, as implemented in the asynchronous synchronization circuit 58 of FIG. 3. Specific detailed embodiments of these aforesaid components, as well as their associated operations, will be further described below with reference to FIGS. 4-12.

The two asynchronous input signals X and Y are first received by the staging circuit 60 of the asynchronous synchronization device 58. The staging circuit 60 is generally configured to detect for rising edges on each of the X and Y input signals and to generate corresponding input pulse signals having a particular pulse width. As one skilled in the art will appreciate, the particular pulse width may include both pulse widths that are predetermined prior to operation, as well as pulse widths that are determined in real time (e.g., during operation of the device 58). In one embodiment, the staging circuit 60 may include a pulse generator or filter circuit for detecting rising edges on the X and Y input signals, as well as delay logic for determining the width of the input pulse signals. For example, upon detecting a rising edge on either the X or Y input signal, the staging circuit 60 may generate corresponding signal pulses, referred to herein as XInputPulse and YInputPulse. The pulse width of each of the XInputPulse and YInputPulse signals may be determined based upon the amount of delay provided by the delay logic. In one embodiment, the delay logic may include variable delay elements to facilitate adjustment or tuning of the input pulse widths if necessary. Once the pulse widths are set, the XInputPulse and YInputPulse signals are output by the staging circuit 60 and subsequently received and processed by the latching circuit 62.

The latching circuit 62 is configured to receive and latch the XInputPulse and YInputPulse signals provided by the staging circuit 60 to produce the latched signals XPulse and YPulse. As one skilled in the art will appreciate, the pulse widths of XInputPulse and YInputPulse represent a minimum amount of time required for the XPulse and YPulse signals to transition to a logical high state. This ensures that the asynchronous X and Y inputs are valid for at least long enough to be latched successfully by the latching circuit 62. Once latched, the XPulse and YPulse signals are then provided to the internal clock generator 64 and the synchronization circuit 66.

The internal clock generator 64 essentially functions to provide a temporary internal clock signal as a reference signal for synchronizing the X and Y input signals. For instance, the internal clock generator 64 is generally switched off or disabled when there are no asynchronous signals to be processed by the asynchronous synchronization device 58. However, once the internal clock generator 64 detects a pulse on either XPulse or YPulse, the internal clock generator 64 is enabled or switched on to provide an internal clock signal Osc to the synchronization circuit 66 for use as a reference signal for synchronizing the X and Y input signals. The internal clock generator 64 may be switched off once again when the X and Y input signal are synchronized. In other words, the Osc signal is provided by the internal clock generator 64 only for the duration necessary for the synchronization of the X and Y input signals by the synchronization circuit 66. In one embodiment, the internal clock generator 64 may include an oscillator circuit for providing the internal clock signal Osc. Further, as shown in the presently illustrated embodiment, the internal clock generator 64 may receive the inverted XPulse and YPulse signals and provide the internal clock signal Osc upon detecting a pulse (or inverted pulse) on either XPulse or YPulse.

The synchronization circuit 66 is generally configured to receive and synchronize the latched XPulse and YPulse signals under the control of the Osc signal provided by the internal clock generator 64. In certain embodiments, the synchronization circuit 66 may include multiple stages of switches or flip-flops, in which XPulse and YPulse are clocked through each switching or flip-flop stage on each oscillation or toggle of the Osc signal. Upon successfully latching the XPulse and YPulse signals, the synchronization circuit 66 may also provide corresponding reset signals EndXPulse and EndYPulse to the latching circuit 62 for the purpose of clearing the latched XPulse and YPulse signals (e.g., transition to a logical low state). Based on the states of XPulse and YPulse, the synchronization circuit 66 essentially functions to generate corresponding synchronized signals by setting the rising and falling edges of the synchronized signals to align with the Osc signal. The resulting operation produces the output signals, XSync and YSync, both of which are synchronized to the common clock domain provided by internal clock signal Osc.

Once the synchronization of the X and Y input signals is complete, the internal clock generator 64 is switched off or disabled, thus terminating the internal clock signal Osc. For instance, the asynchronous synchronization device 58 may include a counter 68 adapted to count for a particular number of oscillations on the Osc signal before disabling the internal clock generator 64. As one skilled in the art will appreciate, the particular number of oscillations may be predetermined (e.g., determined prior to operation of the device 58) or determined in real time (e.g., during operation of the device 58). This ensures that enough oscillations of the Osc signal occur for the synchronization of the X and Y input signals.

In one embodiment, the counter 68 may be initiated once both XPulse and YPulse are reset. For example, as discussed above, the synchronization circuit 66 may reset the XPulse and YPulse signals by providing the corresponding EndX-Pulse and EndYPulse signals to the latching circuit 62. Once both the XPulse and YPulse latches are reset, the counter 68 may be enabled to ensure that enough oscillations of the Osc signal occur. For example, the counter 68 may be configured to count for one oscillation of the Osc signal after both XPulse and YPulse are reset. Thus, after one oscillation of Osc, the counter 68 disables the internal clock generator 64, and the Osc signal is terminated.

As one skilled in the art will appreciate, providing the internal clock signal Osc only for the limited duration required to synchronize the X and Y input signals may yield considerable power savings when compared to the use of a free running external clock signal XCLK when the SDRAM 30 is being controlled synchronously, as discussed above in FIG. 2. Further, as will be discussed below, the counter 68 may be implemented to count for any number of desired oscillations on the Osc signal after XPulse and YPulse are reset. In one embodiment, the counter 68 may be implemented by one or more flip-flops, depending on the number of oscillations required. This provides the advantage and flexibility to extend the number of oscillations provided by the internal clock generator 64 if the Osc signal is required for any logic downstream of the asynchronous synchronization device 58.

As discussed above, the asynchronous synchronization circuitry 58 may optionally include an ordering circuit 70 for further processing the synchronized signals produced by the synchronization circuit 66. As shown in FIG. 3, the ordering circuit 70 may receive both XSync and YSync as well as their respective inverted signals to produce a single output signal OutputPulse. The ordering circuit 70 may be useful in a number of scenarios. For instance, in the event that XSync and YSync arrive simultaneously, the ordering circuit 70 may be configured to process the output signals such that only one or the other signal is outputted on OutPulse, or such that both signals are outputted on OutputPulse in succession.

In one embodiment, the ordering circuit 70 may be further configured to function as a command filter for processing simultaneously received command signals. By way of example, if the XSync and YSync signals represent an increment and a decrement command, respectively, the ordering circuit 70 may be configured to guarantee that the commands are executed in the order they are received. In the event that an increment command and a decrement command are received simultaneously, XSync and YSync may be "canceled out" by the ordering circuit 70 (e.g., no output on OutputPulse) so that neither command is executed, as this would be the net equivalent of executing the commands simultaneously.

Figure 4:
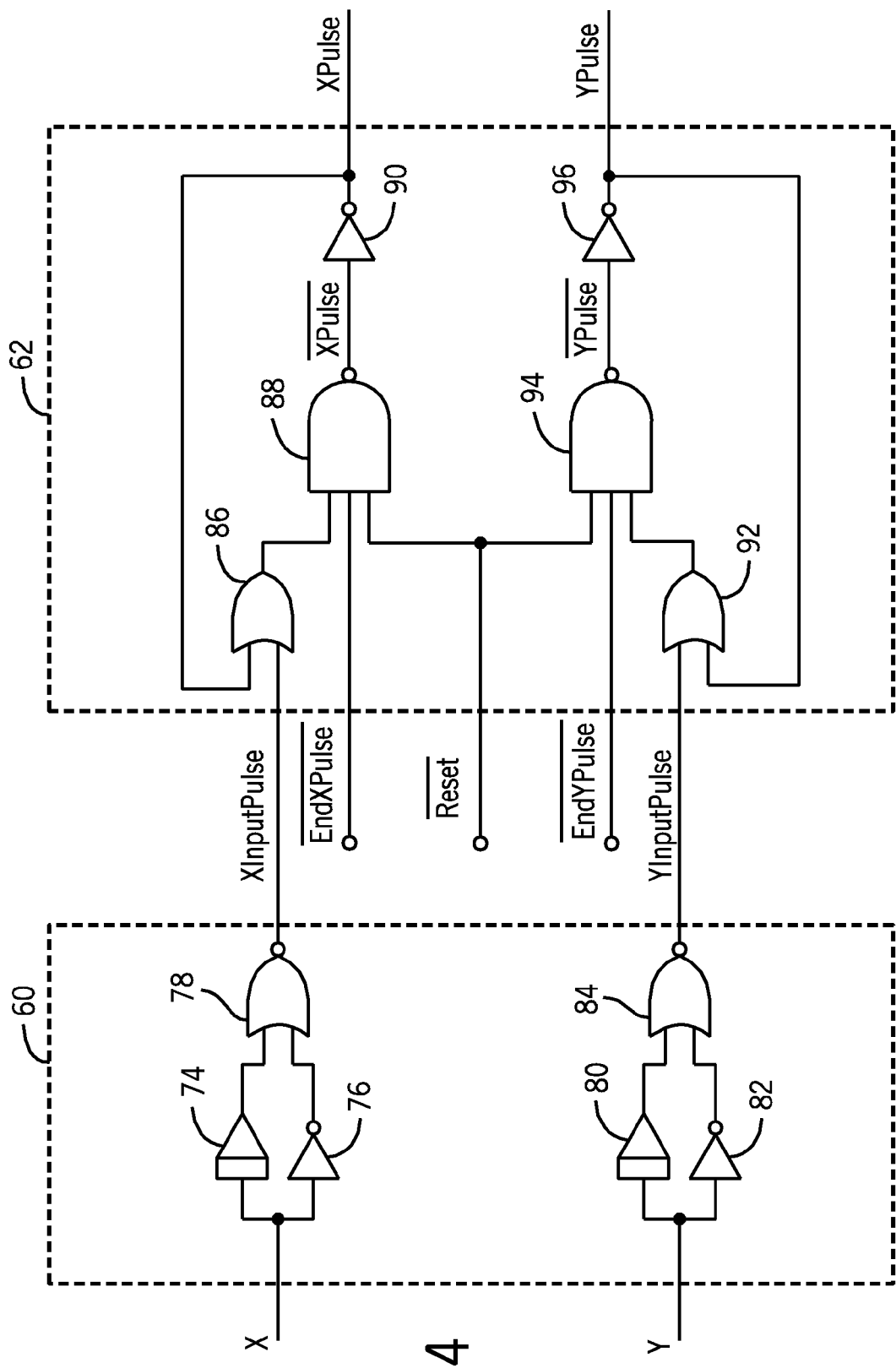
FIG. 4 is a circuit schematic diagram illustrating staging circuitry and latching circuitry which may be used in the asynchronous synchronization device of FIG. 3 in the accordance with an embodiment of the present invention.
Figure 5:
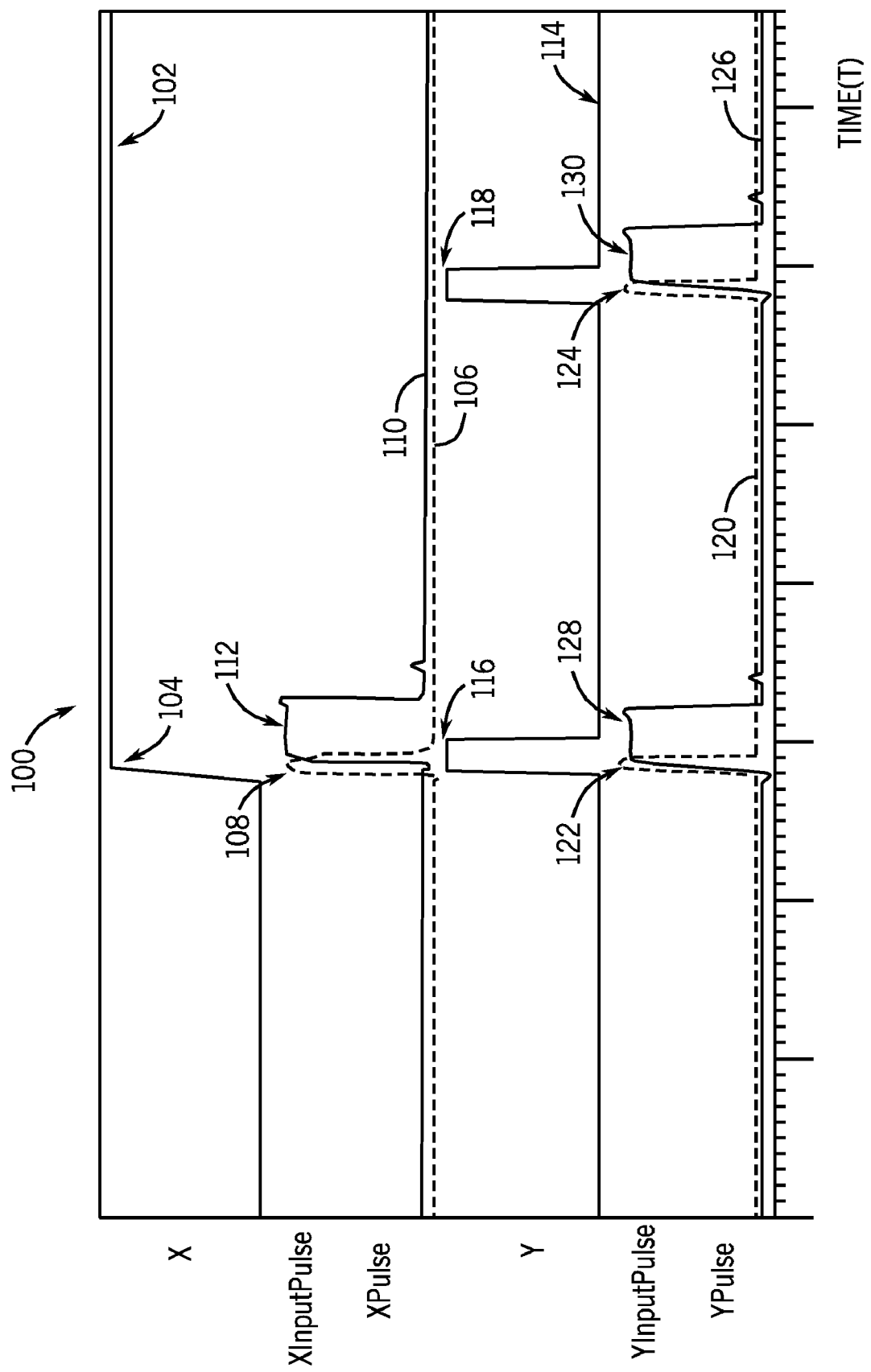
FIG. 5 is a timing diagram depicting the operation of the staging circuitry and latching circuitry of FIG. 4 in the accordance with an embodiment of the present invention.
Figure 6:
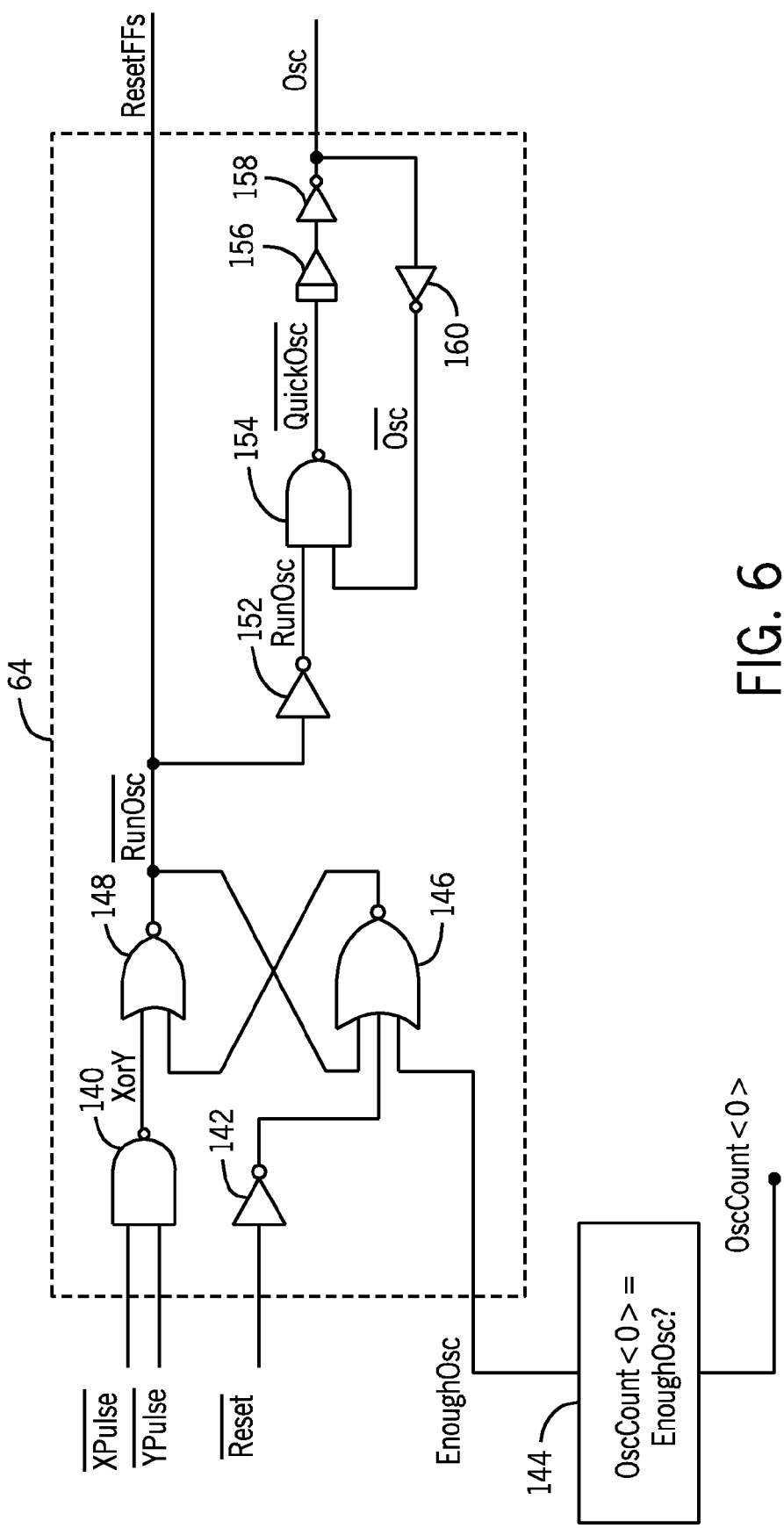
FIG. 6 is a circuit schematic diagram illustrating an oscillator circuit which may be used in the asynchronous synchronization device of FIG. 3 in the accordance with an embodiment of the present invention.
Figure 7:
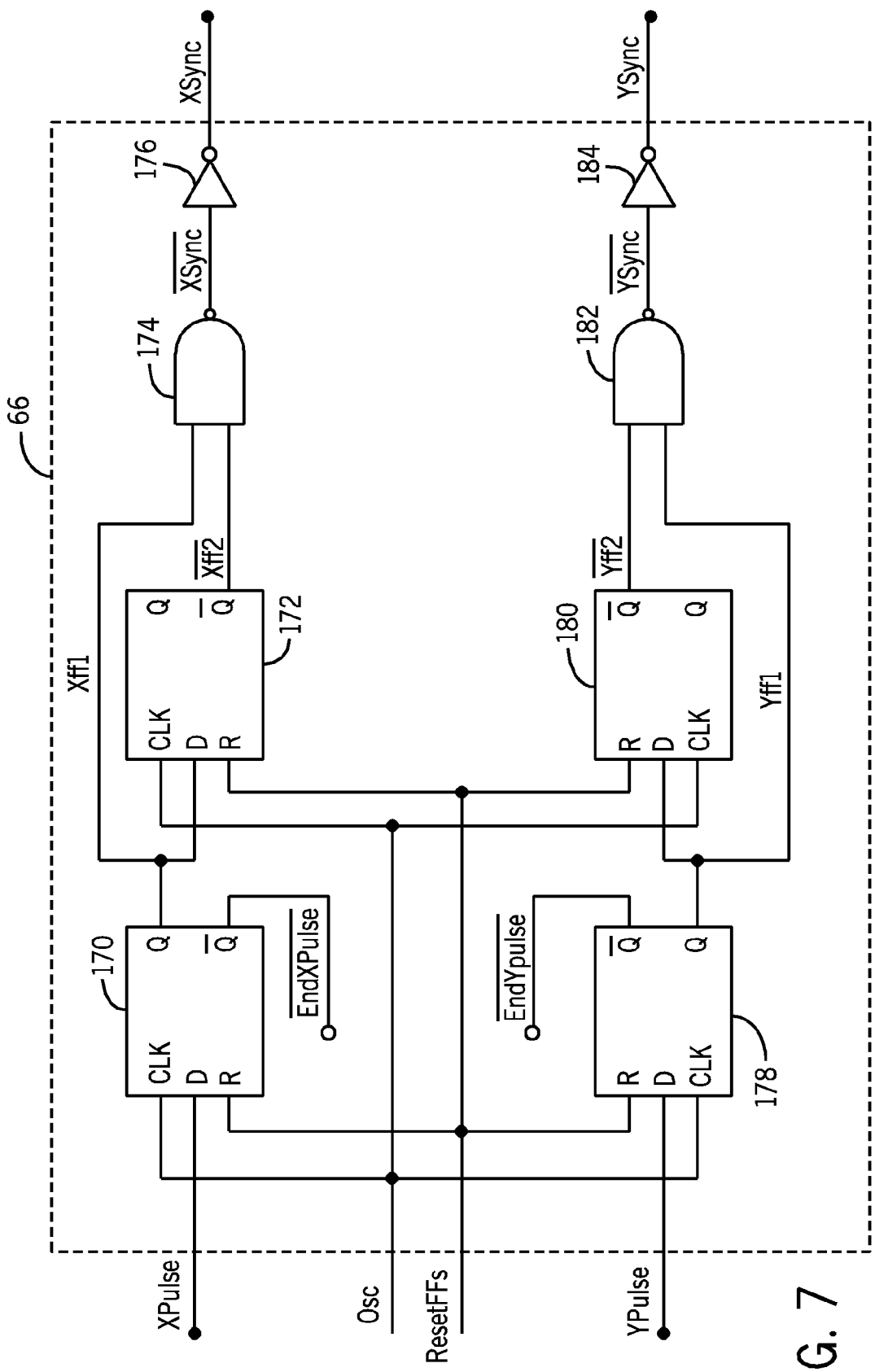
FIG. 7 is a circuit schematic diagram illustrating a synchronization circuit which may be used in the asynchronous synchronization device of FIG. 3 in the accordance with an embodiment of the present invention.
Figure 8:
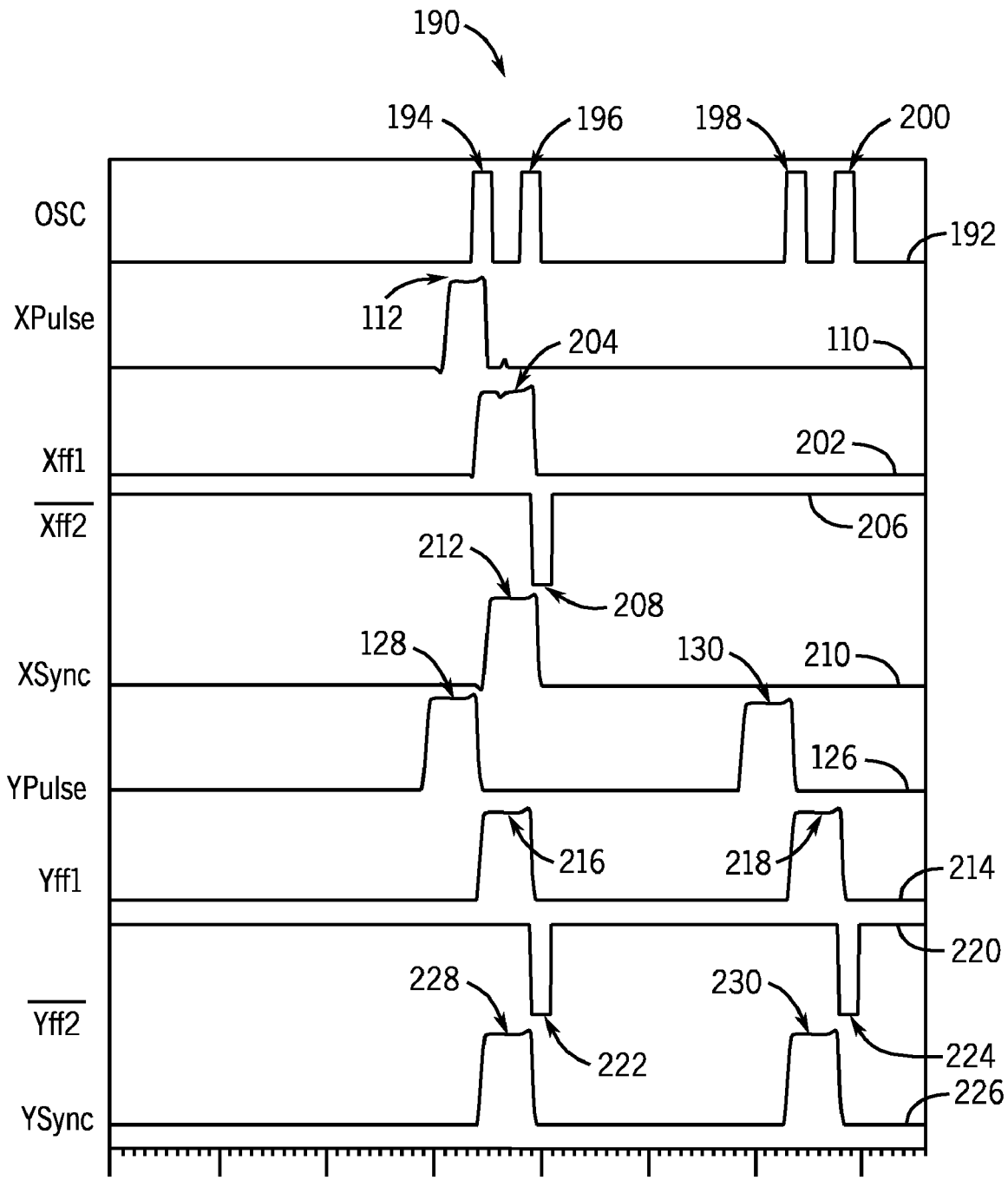
FIG. 8 is a timing diagram depicting the operation of the oscillator circuit of FIG. 6 and the synchronization circuit of FIG. 7 in the accordance with an embodiment of the present invention.
Figure 9:
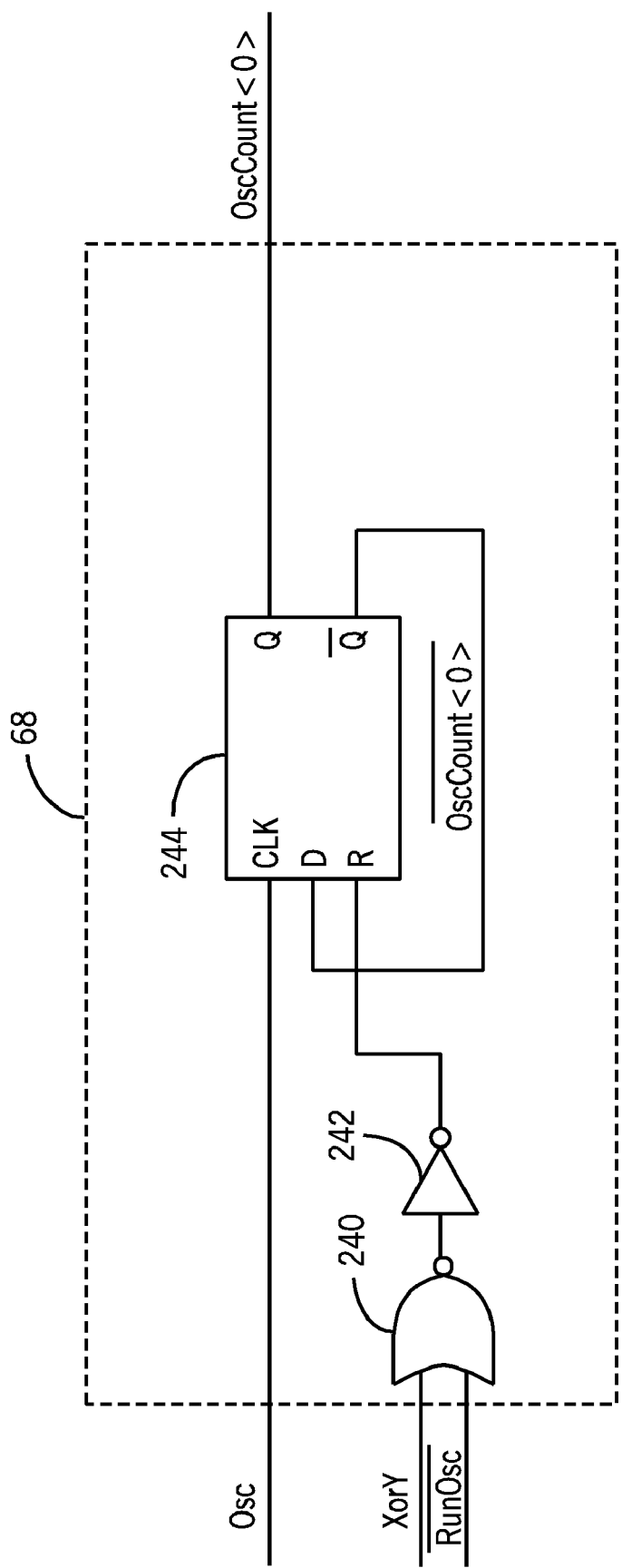
FIG. 9 is a circuit schematic diagram illustrating a counter which may be used in the asynchronous synchronization device of FIG. 3 in accordance with an embodiment of the present invention.
Figure 10:
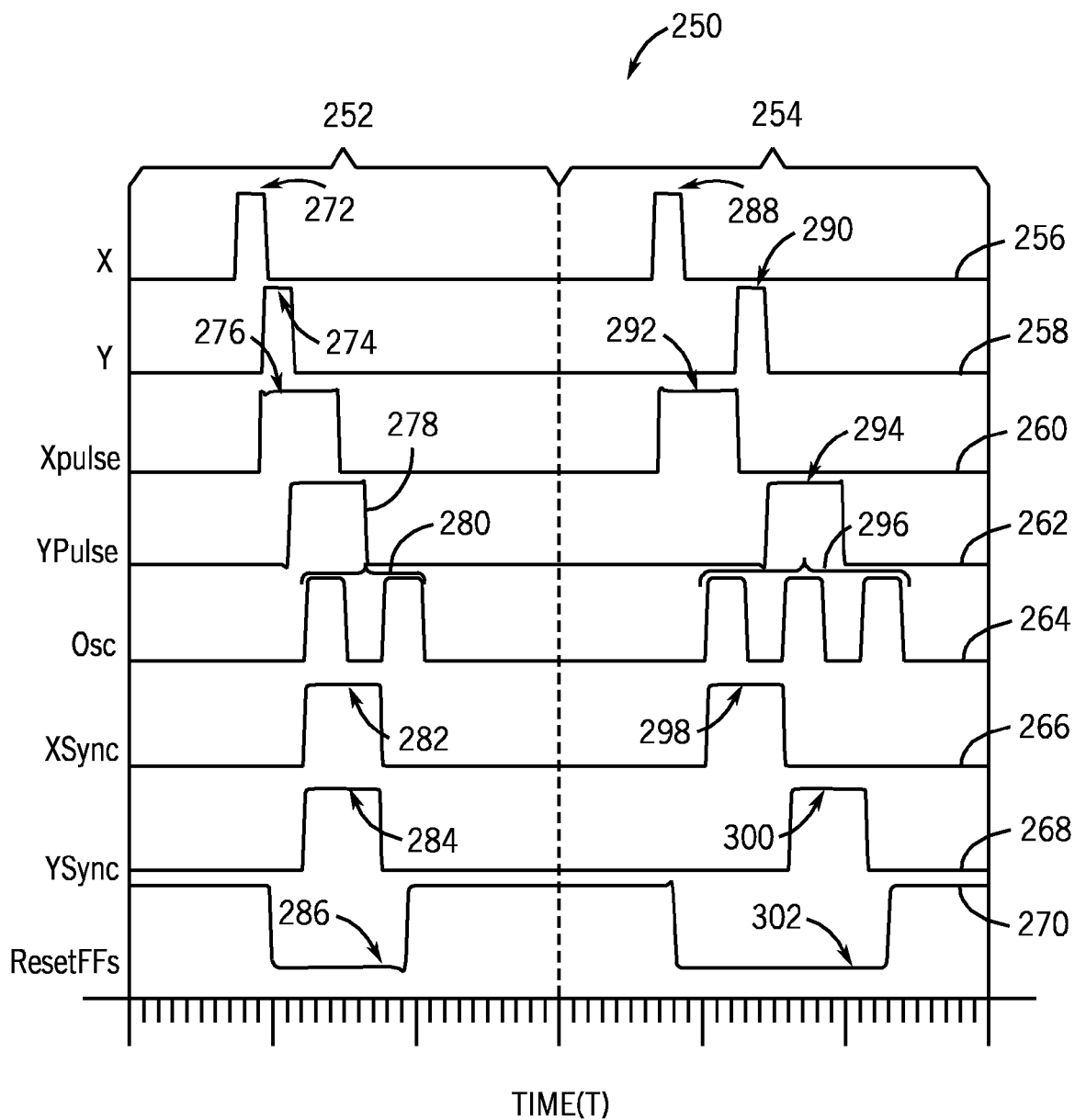
FIG. 10 is a timing diagram depicting the operation of the oscillator circuit of FIG. 6 and the counter of FIG. 9 in accordance with an embodiment of the present invention.

Before proceeding with discussion of FIGS. 4-12, it should be noted that the following figures are provided to illustrate specific embodiments of the above-discussed components of the asynchronous synchronization device 58 illustrated in FIG. 3. Specifically, FIGS. 4, 6-7, 9, and 11-12 provide circuit schematics of certain specific embodiments of the staging circuit 60, latching circuit 62, internal clock generator 64, synchronization circuit 66, counter 68, and ordering circuit 70. FIGS. 5, 8, and 10 depict various timing diagrams illustrating the operation of these components. These figures are merely intended to provide illustrative examples of what may be possible implementations of the present invention. Indeed, the present invention need not be limited to the present examples and may utilize alternate circuit designs and/or configurations depending on a variety of factors, such as cost, efficiency, and business constraints, which may be specific to each implementation.

Referring now to FIG. 4, circuit schematic diagrams of the staging circuit 60 and the latching circuit 62 are illustrated in accordance with an embodiment of the present invention. As discussed above, the staging circuit 60 receives and processes the two asynchronous input signals X and Y to produce corresponding input pulse signals XInputPulse and YInputPulse, each having a particular pulse width. In the presently illustrated embodiment, the staging circuit 60 includes a variable delay 74, inverter 76 and NOR gate 78 arranged to process the X input signal and produce XInputPulse. The staging circuit 60 also includes a variable delay 80, inverter 82, and NOR gate 84 similarly arranged to process the Y input signal and to produce YInputPulse. The variable delays 74 and 80 may include a plurality of gates or buffers, of which all or a subset may be selectively enabled. For instance, in one embodiment, the variable delays 74 and 80 may include eight gates, of which four may be enabled, thus providing a total delay equal to the intrinsic delay of the four enabled gates. For the purposes of this written description, such a configuration will be designated by the notation "4 g of 8" (four gates of eight).

As discussed above, the amount of delay provided by the variable delays 74 and 80 is directly related to the pulse width of XInputPulse and YInputPulse. Further, as can be appreciated by those skilled in the art, additional gates may be enabled or disabled (e.g., 2 g of 8, 6 g of 8) in order to vary the width of the input pulses. Once the pulse widths of XInputPulse and YInputPulse are set, these signals are provided to the latching circuit 62. As discussed above, the latching circuit 60 is generally configured to latch data represented by the XInputPulse and YInputPulse to produce the corresponding XPulse and YPulse signals. By setting XInputPulse and YInputPulse to a particular width, the staging circuit 60 ensures that the input signals are valid long enough to be latched by the latching circuit 62 in order for XPulse and YPulse to transition to a logical high state. As illustrated in FIG. 4, the latching circuit 62 includes an OR gate 86, a NAND gate 88, and an inverter 80 arranged to receive and latch XInputPulse to produce XPulse. The latching circuit 62 further includes an OR gate 92, a NAND gate 94, and an inverter 96 similarly arranged to receive and latch YInputPulse to produce YPulse.

A Reset signal, provided as an input to NAND gates 88 and 94 may be used to initialize the latching circuit 62, for example, when the asynchronous synchronization device 58 is first initialized. As discussed above, the asynchronous synchronization device 58 may be enabled by the control logic 36 of the SDRAM 30 by way of the ASYNC_EN control line upon detecting that the SDRAM 30 has entered an asynchronous mode of operation (e.g., external clock XCLK signal is not available). In certain embodiments, the Reset signal may be provided by the control logic 36, and may even be derived from the ASYNC_EN signal. The NAND gates 88 and 94 may also receive the EndXPulse and EndYPulse signals, respectively. As set forth above, the EndXPulse signal may be provided by the synchronization circuit 66 to reset the XPulse latch once XPulse is successfully clocked into the synchronization circuit 66. Similarly, the EndYPulse signal may be provided once YPulse is successfully clocked into the synchronization circuit 66. As will be appreciated, alternate embodiments of the staging circuit 60 and latching circuit 62 are also envisioned.

Turning now to FIG. 5, a timing diagram 100 that may be associated with the processing of the input signals X and Y by the staging circuit 60 and the latching circuit 62 is illustrated. The timing diagram 100 includes a plurality of trace lines representing the various above-described signals. Specifically, the timing diagram 100 depicts the X input signal 102, the XInputPulse signal 106, the XPulse signal 110, the Y input signal 112, the YInputPulse signal 118, and the YPulse signal 124.

As shown in FIG. 5, the X input signal 102 transitions high, as indicated by the rising edge 104. Upon detecting the rising edge 104, the staging circuit 60 generates a corresponding input pulse 108 on the XInputPulse signal, represented by the dashed trace line 106. The XInputPulse signal 106 is then provided to the latching circuit 62 to produce the latched XPulse signal 110. The latched input pulse is represented by the signal pulse labeled 112 on the XPulse signal 110. As discussed above, the width of input pulse 108 may be determined by the variable delay element 74, and represents the minimum amount of time required for XInputPulse 106 to be latched by the latching circuit 62. For instance, as illustrated in timing diagram 100, the rising edge of the latched input pulse 112 transitions in the interval defined by the input pulse 108.

The timing diagram 110 also depicts the Y input signal 114. The Y input signal 114 includes two pulses, as indicated by reference numerals 116 and 118. Upon detecting the rising edge of the first pulse 116, the staging circuit 60 generates a corresponding input pulse 122 on the YInputPulse signal, represented by the dashed trace line 120. The YInputPulse signal 120 is then provided to the latching circuit 62 to produce the latched YPulse signal 126. The latched input pulse is represented by the signal pulse 128 on the YPulse signal 126. The width of input pulse 122, which may be determined by the variable delay element 80, represents the minimum amount of time required for the input pulse 122 on YInputPulse 120 to be latched by the latching circuit 62. As illustrated in timing diagram 100, the rising edge of latched input pulse 128 occurs in the interval defined by the input pulse 122. The second pulse 118 on the Y input signal 114 is processed in a similar manner by the staging circuitry 60 to produce a second input pulse 124 on the YInputPulse signal 120 which is latched by the latching circuitry 62 to produce a second latched input pulse 130 on the YPulse signal 126. As described above, the internal clock generator 64 is enabled upon detecting either the latched input pulse 112 on XPulse 110 or the latched input pulses 128 or 130 on YPulse 126, and an internal clock signal Osc is initiated and provided to the synchronization circuit 66 for use as a reference signal for synchronizing the X and Y input signals.

Continuing now to FIG. 6, a circuit schematic diagram of an oscillator circuit which performs the above-described functions of the internal clock generator 64 is illustrated in accordance with an embodiment of the present invention. The oscillator circuit 64 includes a NAND gate 140, an inverter 142, a comparator 144, NOR gates 146 and 148, an inverter 152, a NAND gate 154, a variable delay 156, and inverters 158 and 160 arranged to produce the internal clock signal Osc. In the present embodiment, the NAND gate 140 processes the inverted XPulse and YPulse signals to produce the X or Y signal which is then processed by the NOR gate 148 to produce the RunOsc signal. The X or Y signal provides an indication of whether at least one of the X or Y input signals has been latched by the latching circuit 62. For instance, the X or Y signal may be asserted upon detecting any one of the pulses 112, 128, or 130, as described in FIG. 5.

The RunOsc signal is processed by the inverter 152 and NAND gate 154 to produce the signal QuickOsc. QuickOsc represents a default frequency of the Osc signal generated by the oscillator circuit 64. The QuickOsc signal may be adjusted to vary the frequency of the internal clock signal Osc where desired. For example, as illustrated in the present embodiment, the QuickOsc signal is further processed by the variable delay 156 and the inverter 158 to produce the Osc signal. As described above, the variable delay 156 may be configured as a 4 g of 8 delay. Additional delay elements within the variable delay 156 may be disabled (e.g., 2 g of 8) or enabled (e.g., 6 g of 8) in order to increase or decrease the frequency of Osc as needed. The RunOsc signal is also output by the oscillator circuit 64 to produce the ResetFF signal. As will be described in further detail below, the ResetFF signal functions to reset one or more components of the synchronization circuit 66 after the X and Y input signals have been synchronized.

The oscillator circuit 64 may also be reset or initialized once the asynchronous synchronization device 58 is enabled. As illustrated herein, the oscillator circuit 64 also receives the above-described Reset signal which is processed by the inverter 142 and NOR gate 146 to initialize the oscillator circuit 64 when the asynchronous synchronization device 58 is enabled. The asynchronous synchronization device 58 may be enabled via the ASYNC_EN control line when the control logic 36 determines that the external clock signal XLCK is no longer available. However, as described above, the oscillator circuit 64 may not actually provide the internal clock signal Osc until an asynchronous input has been latched on either XPulse or YPulse. The Reset signal may also prevent the oscillator circuit 64 from toggling until at least one of the X or Y input signals has been properly latched, as described above. Further, the Reset signal may also operate to clear the inverted XPulse (e.g., output from NAND gate 88) and inverted YPulse (e.g., output from NAND gate 94) signals described above with reference to FIG. 4.

In order to ensure that enough oscillations of Osc occur to successfully synchronize the X and Y input signals before the oscillator circuit 64 is disabled, the oscillator circuit 64 may be configured to continue to oscillate (e.g., provide the Osc clock signal) until the EnoughOsc signal is asserted by the comparator 144 and processed by the NOR gate 146. In the presently illustrated embodiment, EnoughOsc represents a particular number of oscillations counted by the counter 68 after each of the XPulse and YPulse signals are reset (e.g., transition low). As will be described in further detail below, the XPulse and YPulse signals may be reset by the EndXPulse and EndYPulse signals, which are provided once the XPulse and YPulse signals are successfully latched by the synchronization circuit 66. The comparator 144 receives a count signal OscCount<0> which represents the number of oscillations counted once the counter 68 is initiated. If the comparator 144 determines that OscCount<0> is equal to EnoughOsc, then EnoughOsc signal is asserted and the oscillator circuit 64 is disabled, thus terminating the internal clock signal Osc until the X or Y signal is indicates that a subsequent pulse has occurred on either of the XPulse and YPulse signals. The comparator 144 may be provided by any suitable comparator logic, such as a digital comparator, multiplexer, operational amplifier, or the like.

As described above, the limited need for the internal clock signal Osc (e.g., for only the duration required to synchronize the X and Y input signals) during asynchronous operation of the SDRAM 30 may offer significant power savings when compared to the synchronous operation of the SDRAM 30 under the control of a free running external clock signal XCLK. As will be appreciated by those skilled in the art, a number of specific arrangements of components may be implemented in accordance with the present techniques. The presently illustrated oscillator circuit 64 is simply provided by way of example.

Referring now to FIG. 7, a circuit diagram of the synchronization circuit 66 is illustrated in accordance with an embodiment of the present invention. The synchronization circuit 66 includes a number of flip-flops 170, 172, 178, and 180, the NAND gates 174 and 182, and the inverters 176 and 184, arranged to process the XPulse and YPulse signals to produce the synchronized XSync and YSync signals. Each of the flip-flops 170, 172, 178, and 180 is clocked by the Osc signal provided by the oscillator circuit 64. For instance, as shown in FIG. 7, the Osc signal is coupled to the clock input on each of the flip-flops 170, 172, 178, and 180.

As can be appreciated, the flip-flops 170 and 178 represent a first synchronization stage, and the flip-flops 172 and 180 represent a second synchronization stage in which the XPulse and YPulse signals are processed by the synchronization circuit 66 to produce the XSync and YSync output signals. Once a pulse is detected on either XPulse or YPulse, the oscillator circuit 64 is enabled, and XPulse and YPulse are clocked through each of the first and second synchronization stages of the synchronization circuit 66 on successive oscillations on the Osc signal. For instance, during the first oscillation of the Osc signal, the XPulse and YPulse inputs are latched by the first synchronization stage into the flip-flops 170 and 178, respectively. The flip-flop 170 provides the output signals Xff1 and EndXPulse, and the flip-flop 178 provides the outputs Yff1 and EndYPulse. Xff1 is received by the NAND gate 174 which causes a rising edge to occur on XSync signal. Similarly, Yff1 is received by the NAND gate 182, causing a rising edge to occur on the YSync signal. As described above, EndXPulse and EndYPulse are provided to the latching circuit 62 to reset XPulse and YPulse signals by clearing the XPulse and YPulse latches.

On the second oscillation of Osc, the Xff1 and Yff1 output signals from the first synchronization stage are latched into the flip-flops 172 and 180 of the second synchronization stage, respectively. The flip-flop 172 provides an inverted output signal Xff2 to the NAND gate 174 which causes a subsequent falling edge to occur on the XSync signal. Thus, the rising edge produced during the first oscillation of Osc and the falling edge produced during the second oscillation of Osc collectively define a signal pulse on the XSync signal. Similarly, an inverted output signal Yff2 produced by the flip-flop 180 causes a falling edge to occur on the YSync signal, thus defining a pulse on the YSync signal. As will be appreciated by those skilled in the art, the XSync and YSync signals produced by the synchronization circuit 66 represent the asynchronous inputs X and Y received by the staging circuit 60, but commonly synchronized to the internal clock signal Osc provided by the oscillator circuit 64.

Once the synchronized XSync and YSync signals are determined, the oscillator circuit 64 is disabled and the synchronization circuit 66 may be reset. For instance, as described above, the oscillator circuit 64 may provide the ResetFF signal once the asynchronous X and Y input signals are synchronized. In the presently illustrated embodiment, the ResetFF signal is provided to the reset input on each of the flip-flops 170, 172, 178, and 180. This functions to clear each of the flip-flops 170, 172, 178, and 180 until subsequent input pulses are detected on either XPulse or YPulse.

The presently illustrated synchronization circuit 66 advantageously provides for the synchronization of asynchronous signals using only two stages of flip-flops. As will be appreciated, alternate embodiments of the synchronization circuit 66 are also envisioned. For instance, although the above components have been described primarily as receiving two input signals, X and Y, the presently described techniques are equally applicable in embodiments involving more than two input signals. In such embodiments, additional flip-flop logic may be incorporated into each of the two synchronization stages for processing each additional signal to be synchronized to the Osc signal. By way of example, if a third signal, Z, is to be synchronized, the first synchronization stage may include the flip-flops 170 and 178 for receiving the XPulse and YPulse signals, as well as an additional flip-flop for receiving a ZPulse signal (not shown). Similarly, the second synchronization stage may include the flip-flops 172 and 180, as well as an additional flip-flop for further processing the ZPulse signal to produce an inverted Zff2 output signal, such that a ZSync signal (not shown) may be subsequently output from the synchronization circuit 66.

Turning now to FIG. 8, a timing diagram 190 that may be associated with the processing of the above-described XPulse signal 110 and the YPulse signal 126 of FIG. 5 by the synchronization circuit 66 is illustrated. The timing diagram 190 includes a plurality of trace lines representing the Osc signal 192, the Xff1 signal 202, the inverted Xff2 signal 206, the XSync signal 210, the Yff1 signal 214, the inverted Yff2 signal 220, and the YSync signal 226. In order to better facilitate the present discussion, trace lines corresponding to the XPulse signal 110 and the YPulse signal 126 of FIG. 5 have also been reproduced in the timing diagram 190 and numbered with like reference numerals. As illustrated in the timing diagram 190, the pulse 112 on the XPulse signal 110 and the pulse 128 on the YPulse signal 126 occur simultaneously. As discussed above, the oscillator circuit 64 is enabled upon detecting a pulse on either XPulse 110 or YPulse 126, and the internal clock signal Osc 192 begins to oscillate.

During the first oscillation 194 of the Osc signal 192, the pulse 112 on the XPulse signal 110 is latched into the flip-flop 170, as described above with reference to FIG. 7. The output Xff1 202 of the flip-flop 170 transitions high during the first oscillation 194, as indicated by the rising edge on the pulse 204, and further causes the XSync signal 210 to transition high, as indicated by the rising edge on the pulse 212 of XSync 210. The flip-flop 170, upon latching the XPulse signal 110, also outputs the EndXPulse signal (not shown) for clearing the XPulse latch and resetting the XPulse signal, represented herein by the falling edge of the pulse 112 on the XPulse signal 110.

The processing of the simultaneous pulse 128 on the YPulse signal 126 occurs in a similar manner. For instance, during the first oscillation 194 of Osc 192, the pulse 128 on the YPulse signal 126 is latched into the flip-flop 178, and causes the output signal Yff1 214 of the flip-flop 178 to transition to a logical high state. This is represented by the rising edge on the pulse 216 of the Yff1 signal 214, which further causes the YSync signal 226 to transition high, as indicated by the rising edge on the pulse 228 of YSync 226. Similarly, once YPulse is latched by the flip-flop 178, the YPulse latch in the latching circuit 62 may be cleared by the EndYPulse signal (not shown). This operation is represented by the falling edge of the pulse 128 on YPulse 126.

On the second oscillation 196 of Osc, the Xff1 signal 202 and the Yff1 signal 214 are respectively latched into the flip-flops 172 and 180 of the second synchronization stage of the synchronization circuit 66. This causes the inverted output Xff2 206 of the flip-flop 172 and the inverted output Yff2 220 to transition low, as represented by the falling edges of the pulses 208 and 222, respectively. The transition on the Xff2 signal 206 causes the XSync signal 210 to transition low, as indicated by the falling edge on the pulse 212 and, similarly, the transition on the Yff2 signal 220 causes the YSync signal 226 to transition low, as indicated by the falling edge on the pulse 228. Thus, the above-described rising and falling edges caused on XSync 210 and YSync 226 during the oscillations 194 and 196 of the internal clock signal Osc 192 define the widths of the pulses 212 and 228 on XSync 210 and YSync 226, respectively. As can be appreciated, the width of the pulses 212 and 228 are equal to one clock period ($t_{CK}$) of the Osc signal 192. Thus, XSync 210 and YSync 226, which represent the asynchronous input signals X and Y, respectively, are now synchronized with respect to the Osc signal 192.

Once the synchronized pulses 212 and 228 are output on the XSync 210 and YSync 226 signals, respectively, the oscillator circuit 64 is shut off and the Osc signal 192 is terminated until a subsequent pulse is detected on either the XPulse 110 or YPulse 126 signal. For instance, as illustrated in the timing diagram 190, the Osc signal 192 transitions and remains low after the second oscillation 196. Once a subsequent second pulse 130 is detected on the YPulse signal 126, the oscillator circuit 64 is enabled once again and the Osc signal 192 begins a second series of oscillations, as represented by the pulses 198 and 200. The second pulse 130 on YPulse 126 is processed in the same manner as the first pulse 128, described above. During the first oscillation 198 of Osc 192, the second pulse 130 is latched into the synchronization circuit 66, causing the Yff1 214 and YSync 226 signals to transition high, as indicated by the rising edges on pulses 218 and 230, respectively. During the second oscillation 200, the inverted Yff2 signal transitions low, as indicated by the falling edge of the pulse 224, and causes the YSync signal 226 to transition low, as well. Thus, the width of the pulse 230 on YSync 226, which is defined by the rising and falling edges causes during the first oscillation 198 and the second oscillation 200, is equivalent to one $t_{CK}$ of the internal clock signal Osc 192. The pulse 230 represents an input received on the asynchronous Y input signal that is synchronized with respect to the Osc signal 192. Thereafter, the oscillator circuit 64 is shut off and the Osc signal 192 is terminated once again.

As discussed above, the asynchronous synchronization device 58 may include a counter 68 to ensure that enough oscillations occur on the internal clock signal Osc to properly synchronize the asynchronous X and Y inputs. For instance, the counter 68 may be configured to count a particular number of oscillations on the Osc signal prior to shutting off the oscillator circuit 64. Referring now to FIG. 9, a circuit schematic diagram depicting a counter 68 of the asynchronous synchronization device 58 is illustrated in accordance with an embodiment of the present invention. The presently illustrated counter 68 includes a NOR gate 240, an inverter 242, and a flip-flop 244 arranged to count for one oscillation of the Osc signal after both the XPulse and YPulse signals are reset (e.g., via EndXPulse and EndYPulse).

The counter 68 receives the inverted RunOsc signal and the X or Y signal which, as discussed above, indicates the presence (or absence) of a latched input pulse on either the XPulse or YPulse signals. The inverted RunOsc signal and the X or Y signal are processed by the NOR gate 240 and the inverter 242 and provided to the reset input of the flip-flop 244. As can be appreciated, the present arrangement initializes the flip-flop 244 when the RunOsc signal is high (inverted RunOsc signal is low), indicating that the oscillator 64 is presently enabled, and the X or Y signal is low, indicating that the XPulse and YPulse latches have been reset. The flip-flop 244 then counts for one oscillation of the Osc signal. Once one oscillation has been counted, the comparator 144, as described above with reference to FIG. 6, provides the EnoughOsc signal to shut off and disable the oscillator circuit 64. Once the oscillator circuit 64 is disabled, the RunOsc signal transitions low (inverted RunOsc transitions high) and clears the flip-flop 244, thus resetting the OscCount<0> signal to 0.

As will be appreciated by those skilled in the art, the presently illustrated oscillator circuit 64 is simply provided by way of example. As will be described in additional detail below, alternate embodiments of the counter 68 may be configured to count for more than one oscillation. This may be desirable, for instance, in designs where additional logic downstream of the asynchronous synchronization device 58 may require the Osc signal to provide a temporary clock for further processing of the synchronized XSync and YSync signals. Indeed, a number of specific arrangement of components may be implemented in accordance with the present techniques.

Referring now to FIG. 10, a timing diagram 250 that may be associated with the processing of various above-described signals in conjunction with the counter 68 of FIG. 9 is illustrated. The timing diagram 250 includes a plurality of trace lines representing the asynchronous X input 256, the asynchronous Y input 258, the latched input pulse signal XPulse 260, the latched input pulse signal YPulse 262, the internal clock signal Osc 264, the synchronized XSync signal 266, the synchronized YSync signal 268, and the ResetFF signal 270. The interaction of the above signals, as illustrated in FIG. 10, is intended to illustrate the initialization and termination of the Osc signal when processing the asynchronous input signals X 256 and Y 258 under two different scenarios, indicated herein by the reference numerals 252 and 254. Specifically, the first scenario 252 illustrates the initialization and termination of the Osc signal when both XPulse 260 and YPulse 262 are high during a common oscillation of the Osc signal 264. The second scenario 254, illustrates the initialization and termination of the Osc signal when XPulse 260 and YPulse 262 are high on successive oscillations of the Osc signal 264.

Referring initially to the first scenario 252, the asynchronous input pulses 272 and 274 on the X and Y inputs 256 and 258 occur close enough such that the pulses overlap, as illustrated in FIG. 10. The X input 256 and Y input 258 are processed by the staging circuit 60 and the latching circuit 62, for example, to produce the resulting pulses 276 and 278 on XPulse 260 and YPulse 262. As described above with reference to FIG. 6, the oscillator circuit 64 is enabled once the X or Y signal indicates that either XPulse 260 or YPulse 262 have transitioned high. Thus, upon detecting the rising edge of the pulse 276, the oscillator circuit 64 is enabled and causes the ResetFF signal to transition low and initialize the flip-flops of the synchronization circuit 66, as indicated by the pulse 286. At the same time, the Osc signal 264 is initialized and begins to oscillate, as generally indicated by the pulses occurring in the interval 280, and the pulses 282 and 284, which are synchronized to the Osc signal 264, are produced on XSync 266 and YSync 268, respectively. Because XPulse 260 and YPulse 262 transition high during the first oscillation of the Osc signal 264 in the interval 280, the resulting pulses 282 and 284 occur during the same period of the Osc signal 264.

As shown in FIG. 10, both XPulse 276 and YPulse 278 are high during the first oscillation in the interval 280, as indicated by the pulses 276 and 278, respectively. These signals are latched into the first stage of the synchronization circuit 66 and subsequently reset by the EndXPulse and EndYPulse signal during the first oscillation of Osc 264 in the interval 280. Once XPulse 276 and YPulse 278 are both reset, the counter 68 is initialized and counts for one oscillation of Osc before disabling the oscillator circuit 64. For instance, on the second oscillation of the interval 280, the counter 68 will indicate a count of one on the OscCount<0>, and the EnoughOsc signal is asserted, thus disabling the oscillator circuit 64. Accordingly, the Osc signal 264 terminates after the second oscillation, as indicated by the end of the interval 280, and the ResetFF signal 270 transitions high and resets the flip-flops of the synchronization circuit 66.

Referring now to second scenario 254, the asynchronous input pulses 288 and 290 occur on the X and Y inputs 256 and 258 in succession. The X input 256 and Y input 258 are processed to produce the resulting pulses 292 and 294 on XPulse 260 and YPulse 262. When the rising edge of the pulse 292 is detected on XPulse 260, the oscillator circuit 64 is enabled and causes the ResetFF signal to transition low and initialize the flip-flops of the synchronization circuit 66, as indicated by the pulse 302. Meanwhile, the Osc signal 264 is initialized and begins to oscillate, as generally indicated by the pulses occurring in the interval 296. The XPulse 260 and YPulse 262 signals are processed to produce the pulses 298 and 300 on XSync 266 and YSync 268, each of which are synchronized to the Osc signal 264.

In contrast to the above-described first scenario 252, XPulse 260 and YPulse 262 transition high in the second scenario 254 on subsequent oscillations of the Osc signal 264. For instance, on the first oscillation in the interval 296, only XPulse 260 is high, and on the second oscillation in the interval 296 only YPulse 262 is high. Thus, the resulting pulses 298 and 300 on XSync 266 and YSync 268 occur in succession on consecutive periods of the Osc signal 264.

Further, as shown in the second scenario 254, the Osc signal 264 provides three oscillations (interval 296) as opposed to the two oscillations (interval 280) required in the first scenario 252. This is due to the pulse 292 on XPulse 260 and the pulse 294 on YPulse 262 being detected on successive oscillations of the Osc signal 264. For instance, on the first oscillation in the interval 296, only the pulse 292 on XPulse 260 is detected and latched into the synchronization circuit 66. XPulse 260 is then reset by the EndXPulse signal. However, because YPulse 262 has not been latched by the synchronization circuit 66 and reset, the counter 68 remains disabled. On the second oscillation in the interval 296, the pulse 294 on YPulse 262 is latched into the synchronization circuit 66 and reset by the EndYPulse signal. At this point, both XPulse 260 and YPulse 262 have been cleared, and the counter 68 is initiated to count for one oscillation of Osc before disabling the oscillator circuit 64. For instance, on the third oscillation in the interval 296, the counter 68 will indicate a count of one on the OscCount<0>, and the EnoughOsc signal is asserted, thus disabling the oscillator circuit 64. Accordingly, the Osc signal 264 terminates after the third oscillation, as indicated by the end of the interval 296, and the ResetFF signal transitions high 270 and resets the flip-flops of the synchronization circuit 66.

Figure 11:
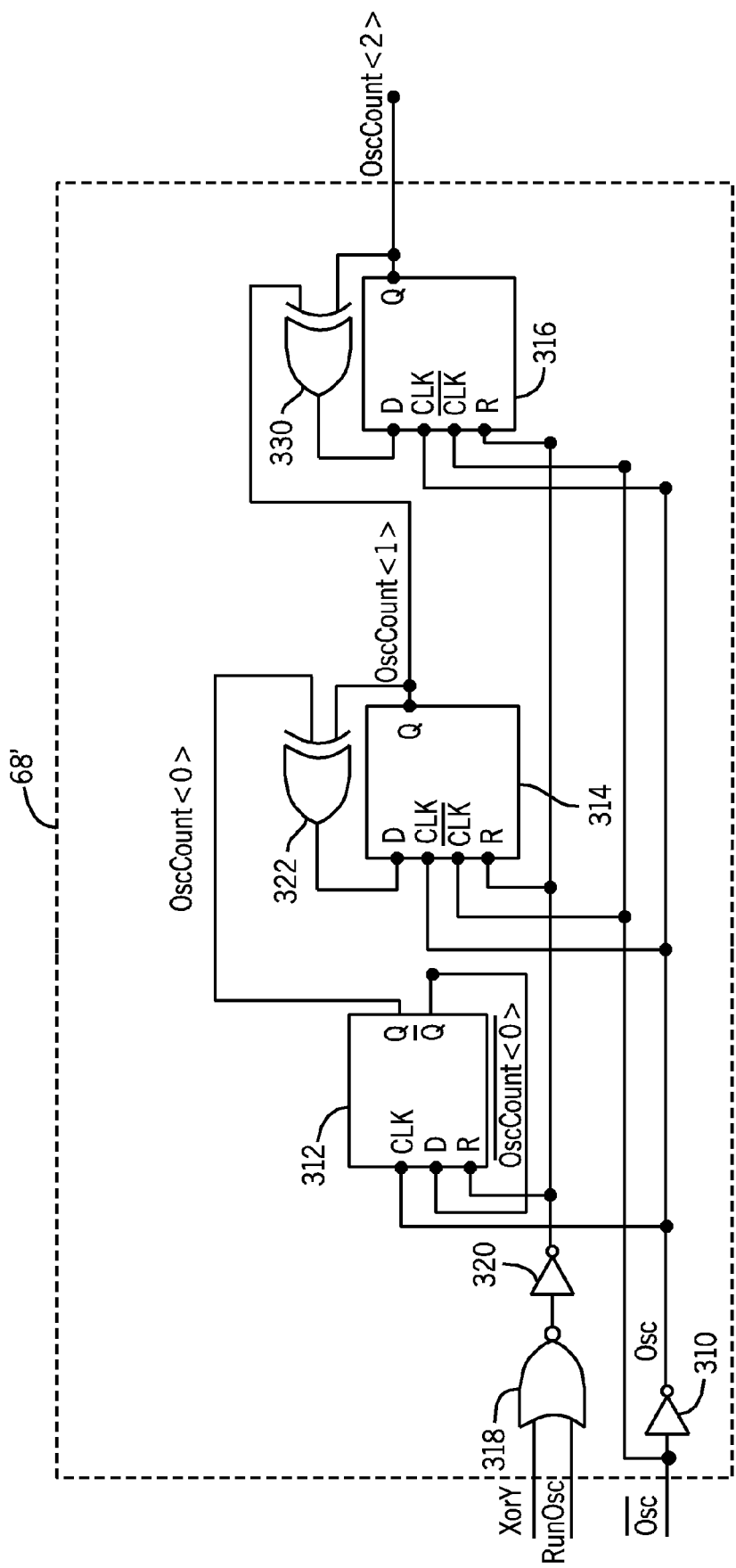
FIG. 11 is a circuit schematic diagram illustrating a counter which may be used in the asynchronous synchronization device of FIG. 3 in accordance with an alternate embodiment of the present invention.

As discussed above, the counter 68 may be adapted to count for more than one oscillation of the Osc signal depending on the unique requirements specific to each implementation. FIG. 11 illustrates an embodiment of the counter, designated by the reference numeral 68', which is configured to count for 3 oscillations after the XPulse and YPulse signals are reset. The counter 68' includes inverters 310 and 320, flip-flops 312, 314, and 316, a NOR gate 318, and XOR gates 322 and 330 arranged to produce a count of three oscillations of the Osc signal after XPulse and YPulse are reset. The counter 68' receives the X or Y signal and the inverted RunOsc signal. Once the XPulse and YPulse signals are reset during the operation of the oscillator circuit 64, the flip-flops 312, 314, and 316 of the counter 68' are initialized and begin to count the oscillations on the Osc signal. Each flip-flop 312, 314, and 316 is clocked by the Osc signal. For instance, after one oscillation of the Osc signal, the OscCount<0> output of the flip-flop 312 indicates a count of one. The OscCount<0> output is processed by the XOR gate 322, the output of which is provided as an input to the flip-flop 314. After two oscillations of the Osc signal, the OscCount<1> output of the flip-flop 314 indicates a count of two. The OscCount<1> output is then processed by the XOR gate 330 to provide an input to the flip-flop 316. After a third oscillation of the Osc signal, the OscCount<2> output of the flip-flop 316 will indicate that three oscillations have occurred. Upon detecting this condition, the comparator 144, may assert the EnoughOsc signal, thus disabling the oscillation circuit 64 and terminating the Osc signal.

Figure 12:
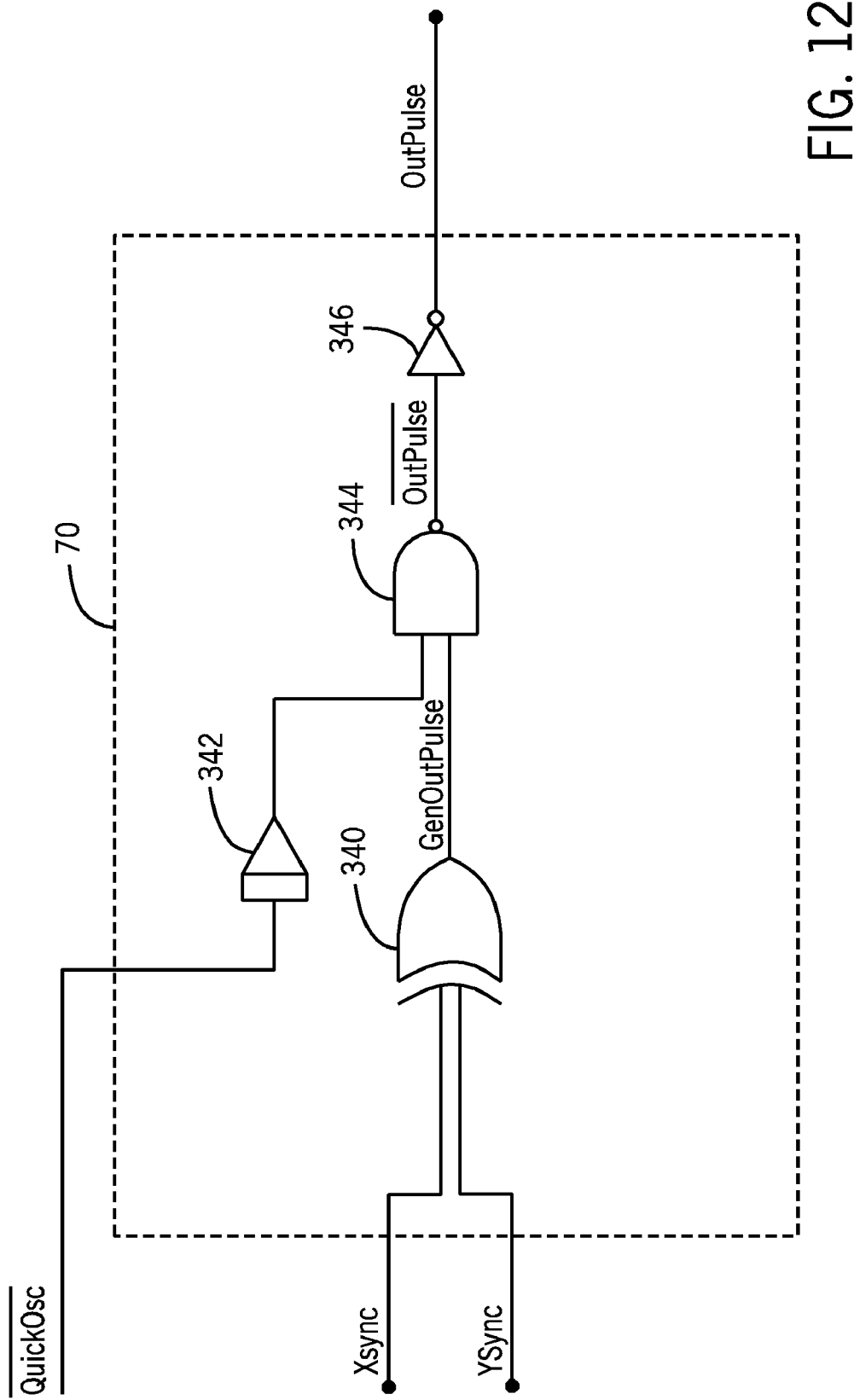
FIG. 12 is a circuit schematic diagram illustrating ordering circuitry which may be used in the asynchronous synchronization device of FIG. 3 in accordance with an embodiment of the present invention.

Continuing now to FIG. 12, a circuit schematic diagram of the ordering circuit 70 is illustrated in accordance with an embodiment of the present invention. The ordering circuit 70 includes an XOR gate 340, a variable delay 342, a NAND gate 344, and an inverter 346 arranged to process the synchronized XSync and YSync signals to produce a single output signal OutPulse. As discussed above, the ordering circuit 70 may be included to provide additional processing of the synchronized signals XSync and YSync produced by the synchronization circuit 66. The ordering circuit also receives the default frequency of the oscillating signal output QuickOsc produced by the oscillator circuit 64. The frequency QuickOsc signal may be adjusted as need by the variable delay 342. For instance, the variable delay 342 may be adjusted to match the delay provided by the variable delay 156, as described above with reference to FIG. 6, such that the output frequency of the variable delay 342 matches the frequency of the Osc signal.

In the present embodiment, the ordering circuit 70 may function as a command filter. For example, the XSync and YSync signals may represent an increment and a decrement command processed by the ordering circuit 70 by way of the XOR gate 340, NAND gate 344, and inverter 346 to produce the OutPulse signal. If the commands on XSync and YSync are received sequentially, the ordering circuit 70 guarantees that the commands are executed sequentially in the order they are received. In the event that an increment command and a decrement command are received simultaneously, XSync and YSync may be "canceled out" by the ordering circuit 70 (e.g., no output on OutPulse) so that neither command is executed, as this would yield the equivalent of simultaneously executing an increment and a decrement command. As will be appreciated, alternate embodiments of the ordering circuit 70 are also envisioned as falling within the scope of the present invention.

Figure 13:
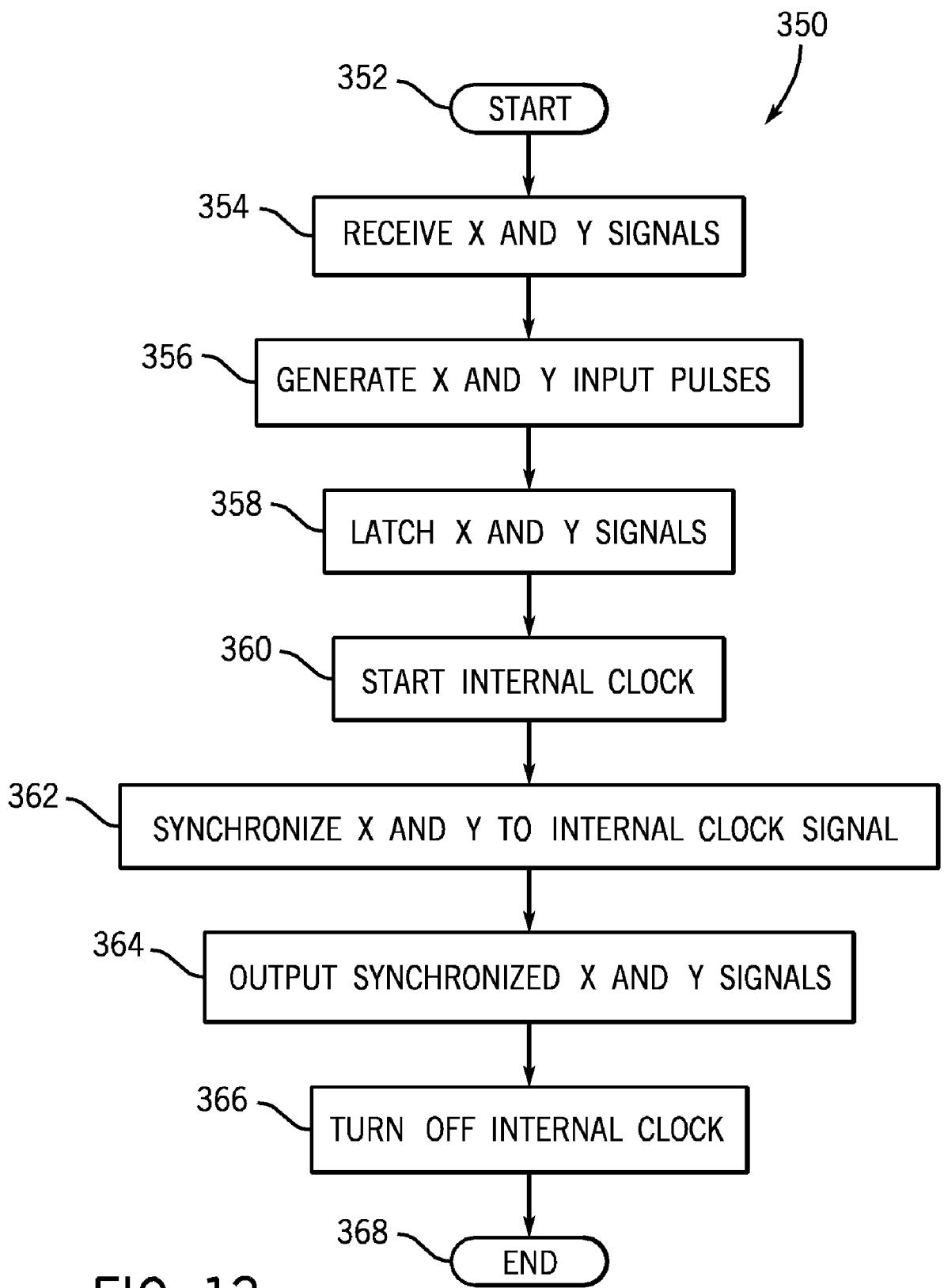
FIG. 13 is a flowchart illustrating a method for synchronizing asynchronous signals without the use of an external clock signal in accordance with an embodiment of the present invention.

Turning now to FIG. 13, a flow chart describing a method for synchronizing two asynchronous input signals X and Y is illustrated in accordance with an embodiment of the present invention. The method, designated generally by reference numeral 350, begins at step 352. At step 354, the asynchronous input signals X and Y are received. The input signals may be processed to generate corresponding input pulses having a particular width, as indicated at step 356. As discussed above, the width of the input pulses represents the minimum amount of time required to successfully latch the input signals X and Y in step 358. An internal clock is enabled at step 360, once either of the asynchronous X and Y signals has been successfully latched. The internal clock signal provides a temporary reference signal that may be used to synchronize the asynchronous X and Y signals, as indicated at step 362. At step 364, the synchronized X and Y signals may be output and provided to any subsequent downstream logic, such as to the memory array 38 (e.g., if the X and Y signals are on the data input bus of SDRAM 30) or to the microprocessor 12 (e.g., if the X and Y signals are on the data output bus of SDRAM 30). Once the X and Y signals are synchronized, the internal clock is turned off at step 366, and the method 350 ends at step 368. Although not shown in FIG. 13, the method 350 may also include the optional step of ordering the synchronized X and Y outputs signals if required, for example, using an ordering circuit (e.g., ordering circuit 70). The use of the internal clock for synchronizing the X and Y signals, as set forth in steps 360 and 362 of FIG. 13, is described in further detail below.

Figure 14A:
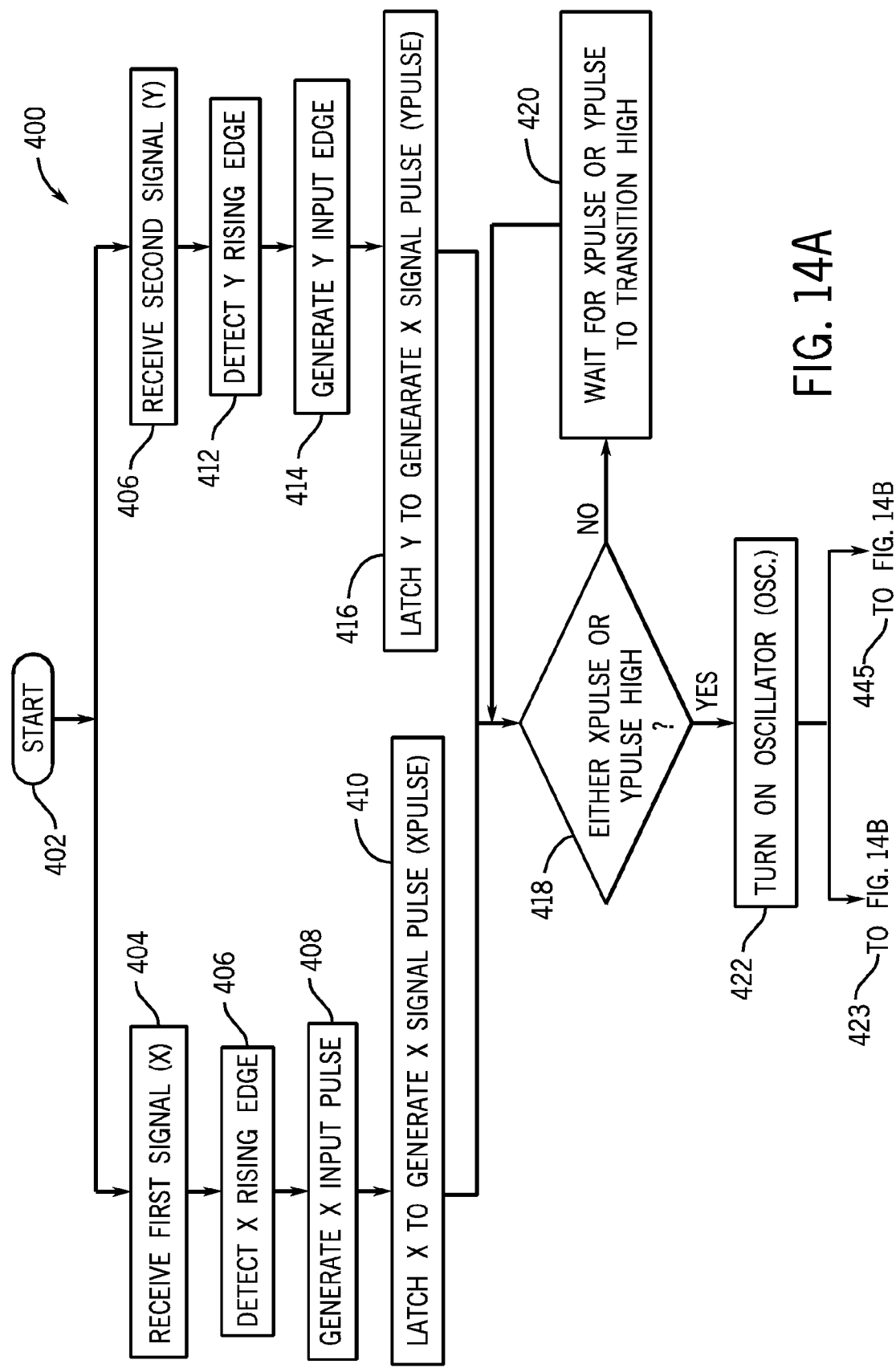
FIGS. 14A-B are flowcharts illustrating a method for initiating an internal clock signal, synchronizing asynchronous signals using the internal clock signal, and disabling the internal clock signal once the asynchronous signals are synchronized, in accordance with an embodiment of the present invention.
Figure 14B:
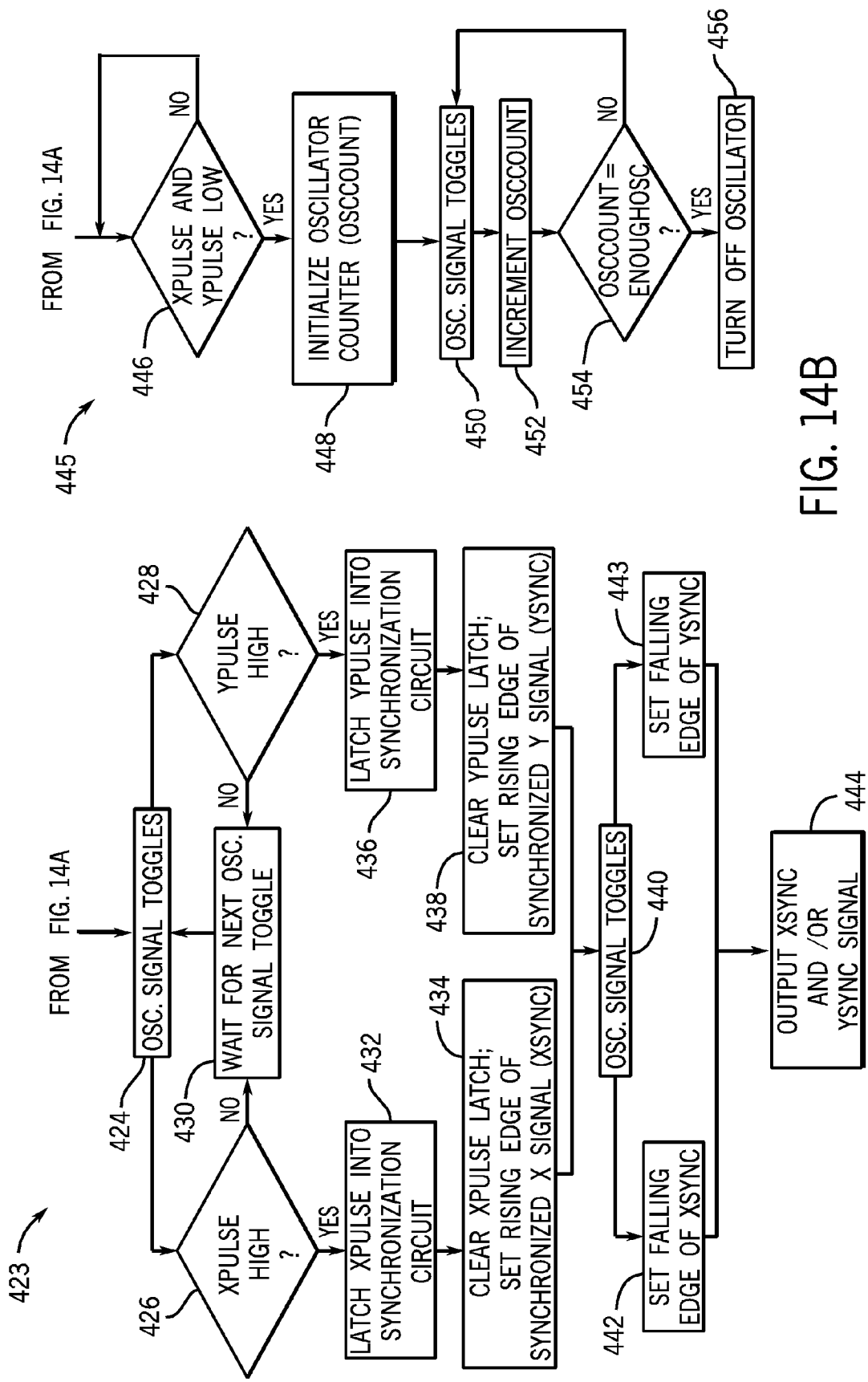

Continuing now to FIGS. 14A and 14B, flowcharts depicting a method for enabling and disabling an internal clock signal for use in synchronizing asynchronous signals is illustrated in accordance with an embodiment of the present invention. Specifically, FIG. 14A illustrates how an internal clock generator (e.g., oscillator circuit 64) may be enabled, and FIG. 14B illustrates how an internal clock signal provided by the internal clock signal provided by an internal clock generator may be used for synchronizing asynchronous signals, such as the X and Y input signals of FIG. 13.

Referring initially to FIG. 14A, the method 400 begins at step 402. The asynchronous X and Y input signals are received at steps 404 and 406, respectively. Once a rising edge is detected on the X input signal, as depicted by step 406, an input pulse corresponding to the X input signal is generated step 408. As discussed above, the input pulse is set to a particular width which represents the minimum amount of time required for the X input pulse to be latched, for example, by the latching circuitry 62, to produce the latched input signal, XPulse.

The Y input signal is similarly processed, as indicated by steps 412-416. For instance, upon detecting a rising edge on the Y input signal at step 412, a corresponding input pulse generated at step 414. Here again, the width of the Y input pulse is set to a particular width representing the minimum amount of time required to latch the Y input pulse to generate the latched input signal YPulse. As illustrated in the scenarios 252 and 254 described above with reference to FIG. 10, the inputs on the X and Y signals may occur either simultaneously or sequentially. It should be noted, however, that the presently illustrated method 400 is equally applicable to either scenario.

At decision block 418, a determination is made as to whether at least one of the XPulse or YPulse signals have transitioned high, indicating that an input on either X or Y has been successfully latched. If no transition is detected on either XPulse or YPulse, the method 400 waits for such a transition, as illustrated by step 420. If either or both of the XPulse or YPulse signals have transitioned high, then an internal clock generator, such as the oscillator circuit 64, is enabled at step 422 to provide the internal clock signal Osc for synchronizing the asynchronous X and Y inputs. As illustrated herein, the output of step 422 may drive two different logic sets, designated in FIG. 14B by reference numerals 423 and 445. As will be discussed in below, the logic represented by reference numerals 423 and 445 may be carried out simultaneously.

Continuing now to FIG. 14B, a first logic set 423 illustrates one embodiment for generating signals that correspond to the X and Y input signals, but are synchronized to the internal clock signal Osc. Once the oscillator is enabled (FIG. 14A, step 422), the internal clock signal Osc begins to oscillate or toggle at step 424. On the first toggle of Osc, determinations are made as to whether XPulse or YPulse are high, as indicated by decision blocks 426 and 428, respectively. As discussed above, at least one of the XPulse or YPulse signals must be high in order to initiate the internal clock signal Osc. Thus, the determinations made at decision blocks 426 and 428 may result in several scenarios, as listed below:

(1) XPulse is high and YPulse is low;
(2) XPulse is low and YPulse is high; or
(3) both XPulse and YPulse are high.

In the first scenario, because the XPulse signal is determined to be high at decision block 426, XPulse is latched into a synchronization circuit at step 432. In one embodiment, the XPulse signal may be latched into a flip-flop of the synchronization circuit 66, as described above with reference to FIG. 7. As discussed above, the synchronization circuit 66 may use the Osc signal as a reference for synchronizing the asynchronous signals. Once the XPulse signal is latched into the synchronization circuit, the XPulse latch is cleared (e.g., via the EndXPulse signal), and a rising edge is set on the signal XSync, which corresponds to the asynchronous X input signal, as indicated by step 434. On the next toggle of the Osc signal at step 440, a falling edge is set on XSync, as indicated by step 442. Thus, the pulse defined by the rising and falling edges created on the XSync signal represent the originally received X input signal (step 404) synchronized with the Osc signal. As shown in the method 400, the YPulse signal, which is determined to be low at decision block 428, is not latched into the synchronization circuit. The method 400 waits until the next toggle of Osc (step 430), before returning to decision block 428 to determine whether YPulse has transitioned high. Thereafter, as illustrated by step 444, the method 423 may include outputting the synchronized XSync signal (e.g., by the synchronization circuit 66).

The reverse situation is represented in the second scenario, wherein the YPulse signal is high and the XPulse signal is low on the first toggle of Osc (step 424). Thus, the YPulse signal is latched into the synchronization circuit at step 436. Next, at step 438, the YPulse latch is cleared (e.g. via the EndYPulse signal) and a rising edge is set on the signal YSync, which corresponds to the asynchronous Y input signal. Thereafter, on the next toggle of the Osc signal at step 440, a falling edge is set on YSync, as indicated by step 443. Thus, the pulse defined by the rising and falling edges created on the YSync signal represent the originally received Y input signal (step 406) synchronized with the Osc signal. The XPulse signal, which is determined to be low at decision block 426, is not latched into the synchronization circuit 66. The method 400 then waits for the next toggle of Osc (step 430), before returning to decision block 426 to determine whether XPulse has transitioned high. Thereafter, as illustrated by step 444, the method 423 may include outputting the synchronized YSync signal (e.g., by the synchronization circuit 66).

In the third scenario, the XPulse and YPulse signals are both high on the first toggle of Osc at step 424. Therefore, as can be appreciated, the above-described steps 426-444 for processing the XPulse and YPulse signals to generate synchronized pulses on the XSync and YSync signals occur in the same manner, but simultaneously. Thus, the resulting output pulses on XSync and YSync occur in the same period and are synchronized with the Osc signal. Further, as illustrated by step 444, the method 423 may include outputting both the synchronized XSync and YSync signals (e.g., by the synchronization circuit 66).

Returning back to step 422 of FIG. 14A, a second logic set 445 may be carried out simultaneously with the above-discussed first logic set 443. In particular, the second logic set 445 illustrates one embodiment for carrying out a series of steps for turning off the oscillator circuit 64 and disabling the internal clock signal Osc. As described above, the oscillator circuit 64 may be shut off once a particular number of oscillations on the Osc signal have occurred. Further, the particular number of oscillations may depend on how many oscillations of the internal clock signal Osc are required for any downstream processing of the XSync or YSync signals, and may be monitored by a counter, such as the counter 68 of FIG. 9, for example. Once the counter 68 determines that the particular number of counts has occurred, a disable signal (e.g., EnoughOsc) may shut off the oscillator circuit 64, thus terminating the internal clock signal Osc until a subsequent pulse is received on either the X or Y input signals.

As discussed above, the counter 68 may be initiated once both the XPulse and YPulse latches are cleared, indicating that both input signals have been successfully latched into the synchronization circuit 66 (steps 432, 436). For instance, at decision step 446, a determination is made as to whether XPulse and YPulse have transitioned low (e.g., reset by EndXPulse and EndYPulse). If one or both of the XPulse and YPulse signals have yet to be reset, then the counter 68 continues to wait until both XPulse and YPulse have transitioned to low before initializing. If, at decision step 446, both XPulse and YPulse are detected as being logically low (e.g., reset), then the counter 68 is reset or initialized at step 448. Thus, in the present embodiment, both of the signals being processed must be reset before the counter is initialized. By way of example, initializing the counter may include resetting a count variable, OscCount, to zero. Once the counter is initialized, the counter monitors the internal clock signal Osc to detect a subsequent toggle, represented by step 450, and increments OscCount at step 452 each time a toggle is detected on the Osc signal.

After each increment, the value of OscCount is compared at with EnoughOsc at decision block 454. EnoughOsc may represent the particular number of oscillations required in order to shut off the oscillator circuit 64. Therefore, if OscCount indicates that EnoughOsc has been met, the oscillator is shut off at step 456. If OscCount indicates that additional oscillations or toggles are required to complete processing of the input signals, the method 445 returns to step 450 and increments OscCount again (step 452) on the next toggle of Osc.

Although the foregoing examples have been discussed primarily with regard to the synchronization of two asynchronous signals, one skilled in the art will appreciate that the present techniques may be applied to the synchronization of any number of asynchronous signals. By way of example, the presently described techniques may be used for the synchronization of a single signal, or even two or more signals to an internal clock signal (e.g., Osc) that is enabled only upon receiving pulses on the asynchronous input signals. As discussed above, the capability to provide a temporarily enabled internal clock signal for only the duration required to synchronize one or more signals offers significant power saving advantages over the use of a free running external system clock.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A device for synchronizing one or more asynchronous signals comprising:
a latching circuit configured to latch one or more asynchronous signals;
an internal clock generator configured to provide an internal clock signal upon detecting that at least one of the one or more asynchronous signals is latched by the latching circuit; and
a synchronization circuit configured to synchronize the one or more latched asynchronous signals to the internal clock signal;
wherein the internal clock generator is configured to terminate the internal clock signal after the one or more latched asynchronous signals are synchronized.

2. The device of claim 1, further comprising a staging circuit configured to set a pulse width of each of the one or more asynchronous signals to a particular width.

3. The device of claim 2, wherein the particular width represents a minimum amount of time required for the latching circuit to latch the one or more asynchronous signals.

4. The device of claim 3, wherein the particular width is set by a delay circuit.

5. The device of claim 4, wherein the delay circuit includes a variable delay.

6. The device of claim 1, wherein the synchronization circuit includes a plurality of flip-flops configured to synchronize the one or more asynchronous signals.

7. The device of claim 6, wherein the plurality of flip-flops are arranged in a first stage and a second stage;
wherein the first stage is configured to latch each of the one or more latched asynchronous signals on a first oscillation of the internal clock signal, reset each of the one or more latched asynchronous signals, and set a rising edge on each of one or more synchronized signals, wherein each of the one or more synchronized signals corresponds to a respective one of the one or more asynchronous signals, and wherein the rising edge on each of the one or more synchronized signals is aligned with a rising edge on the first oscillation of the internal clock signal; and
wherein the second stage is configured to, on a second oscillation of the internal clock signal, set a falling edge on each of one or more synchronized signals.

8. The device of claim 7, wherein the rising edge and falling edge set on each of the one or more synchronized signals defines a pulse width equivalent to one period of the internal clock signal.

9. The device of claim of claim 1, further comprising a counter configured to disable the internal clock generator once a particular number of oscillations of the internal clock signal have occurred.

10. The device of claim 9, wherein the counter is initialized once each of the one or more latched asynchronous signals is reset.

11. The device of claim 1, further comprising ordering circuitry configured to process each of the synchronized signals.

12. The device of claim 11, wherein the ordering circuitry is configured to cancel out synchronized signals occurring in the same period of the internal clock signal.

13. A method for synchronizing one or more asynchronous signals comprising:
receiving one or more asynchronous signals;
latching the one or more asynchronous signals;
generating an internal clock signal;
synchronizing each of the one or more latched asynchronous signals with the internal clock signal; and
disabling the internal clock signal after each of the one or more asynchronous signals is synchronized.

14. The method of claim 13, wherein latching the one or more asynchronous signals includes first setting the pulse width of each of the one or more asynchronous signals to a particular width representing a minimum amount of time required to latch the one or more asynchronous signals.

15. The method of claim 13, wherein the internal clock signal is generated only when at least one of the one or more asynchronous signals is latched.

16. The method of claim 13, wherein synchronizing each of the one or more latched asynchronous signals with the internal clock signal includes setting a rising edge on each of one or more synchronized signals on a first oscillation of the internal clock signal, and setting a falling edge on each of the one or more synchronized signals on a second oscillation of the internal clock signal, wherein each of the one or more synchronized signals corresponds to a respective one of the one or more latched asynchronous signals.

17. The method of claim 16, wherein synchronizing each of the one or more latched asynchronous signals further includes resetting each of the one or more latched asynchronous signals on the first oscillation of the internal clock signal.

18. The method of claim 16, wherein the rising edge on each of one or more synchronized signals is aligned with a rising edge of the first oscillation of the internal clock signal, and wherein the falling edge on each of one or more synchronized signals is aligned with the rising edge of the second oscillation of the internal clock signal.

19. The method of claim 13, wherein disabling the internal clock signal includes transmitting a disable signal after detecting that a particular number of oscillations has occurred on the internal clock signal.

20. A memory device comprising:
a memory array;
a data buffer configured to receive one or more signals;
synchronization logic configured to synchronize each of the one or more signals, the synchronization logic comprising:
synchronous synchronization circuitry configured to synchronize each of the one or more signals using an external clock signal when the memory device is operating in a synchronous mode of operation; and
asynchronous synchronization circuitry configured to synchronize each of the one or more signals without the use of an external clock when the memory device is operating in an asynchronous mode of operation;
wherein the synchronization logic is configured such that only one of the synchronous synchronization circuitry and asynchronous synchronization circuitry operate at the same time.

21. The memory device of claim 20, wherein the asynchronous synchronization circuitry includes an internal clock generator configured to generate an internal clock signal if the one or more signals are received while the memory device is operating in an asynchronous mode of operation, wherein the internal clock signal is used as a reference signal for synchronizing each of the one or more signals.

22. The memory device of claim 21, wherein the internal clock signal is disabled a particular number of oscillations after each of the one or more signals is synchronized.

23. An electronic device comprising:
a processor; and
a clock configured to provide a system clock signal;
a memory device coupled to the processor by at least one data bus and at least one address bus, wherein the memory device comprises:
a memory array;
a synchronous synchronization device configured to receive the system clock signal and to synchronize signals based upon the system clock signal;
an asynchronous synchronization device configured to synchronize signals without the use of the system clock signal; and
a controller coupled to and configured to control each of the synchronous synchronization device and the asynchronous synchronization device;
wherein only one of the synchronous synchronization device and asynchronous synchronization device are enabled at the same time.

24. The electronic device of claim 23, further comprising power regulation circuitry configured to provide one or more low power modes of operation, and wherein the asynchronous synchronization device is enabled when the electronic device is operating in one of the one or more low power modes of operation.

25. The electronic device of claim 23, wherein the asynchronous synchronization device comprises:
circuitry configured to receive one or more asynchronous signals;
an internal clock generator configured to provide an internal clock signal; and
synchronization circuitry configured to synchronize the one or more asynchronous signals to the internal clock signal;
wherein the internal clock generator is configured to be enabled when the one or more asynchronous signals are received and to be disabled when the one or more asynchronous signals are synchronized.

26. The electronic device of claim 23, wherein the memory device comprises an SDRAM.

* * * * *

UNITED STATES PATENT AND TRADEMARK OFFICE
CERTIFICATE OF CORRECTION

PATENT NO.       : 7,936,637 B2
APPLICATION NO.  : 12/165257
DATED            : May 3, 2011
INVENTOR(S)      : Aidan Shori Page 1 of 1

It is certified that error appears in the above-identified patent and that said Letters Patent is hereby corrected as shown below:

In column 22, line 58, in claim 9, after "of claim" delete "of claim".

Signed and Sealed this
Twenty-eighth Day of June, 2011

David J. Kappos
*Director of the United States Patent and Trademark Office*